US009093522B1

(12) United States Patent
Zeng et al.

(10) Patent No.: US 9,093,522 B1
(45) Date of Patent: Jul. 28, 2015

(54) VERTICAL POWER MOSFET WITH PLANAR CHANNEL AND VERTICAL FIELD PLATE

(71) Applicant: MaxPower Semiconductor, Inc., San Jose, CA (US)

(72) Inventors: Jun Zeng, Torrance, CA (US); Mohamed N. Darwish, Campbell, CA (US); Kui Pu, Chengdu (CN); Shih-Tzung Su, Shulin (TW)

(73) Assignee: MaxPower Semiconductor, Inc., San Jose, CA (US)

( * ) Notice: Subject to any disclaimer, the term of this patent is extended or adjusted under 35 U.S.C. 154(b) by 0 days.

(21) Appl. No.: 14/338,303

(22) Filed: Jul. 22, 2014

Related U.S. Application Data

(60) Provisional application No. 61/935,707, filed on Feb. 4, 2014.

(51) Int. Cl.
| | |
|---|---|
| H01L 29/423 | (2006.01) |
| H01L 29/78 | (2006.01) |
| H01L 29/732 | (2006.01) |
| H01L 29/739 | (2006.01) |
| H01L 29/40 | (2006.01) |
| H01L 29/10 | (2006.01) |
| H01L 29/06 | (2006.01) |

(52) U.S. Cl.
CPC ........ *H01L 29/7813* (2013.01); *H01L 29/0634* (2013.01); *H01L 29/1095* (2013.01); *H01L 29/402* (2013.01); *H01L 29/4236* (2013.01); *H01L 29/7397* (2013.01); *H01L 29/7811* (2013.01)

(58) Field of Classification Search
None
See application file for complete search history.

(56) References Cited

U.S. PATENT DOCUMENTS

| | | | |
|---|---|---|---|
| 5,314,834 A | 5/1994 | Mazure et al. | |
| 5,831,292 A | 11/1998 | Harris et al. | |
| 7,393,749 B2 | 7/2008 | Yilmaz et al. | |
| 8,575,685 B2 | 11/2013 | Bobde et al. | |
| 2005/0082542 A1* | 4/2005 | Sumakeris et al. | 257/77 |
| 2007/0034923 A1 | 2/2007 | Liaw | |
| 2009/0212359 A1* | 8/2009 | Hsieh | 257/331 |
| 2010/0308400 A1* | 12/2010 | Darwish et al. | 257/330 |
| 2011/0006361 A1* | 1/2011 | Darwish et al. | 257/329 |
| 2011/0254088 A1* | 10/2011 | Darwish et al. | 257/340 |
| 2012/0261746 A1* | 10/2012 | Darwish et al. | 257/330 |
| 2014/0077289 A1 | 3/2014 | Miyajima | |

OTHER PUBLICATIONS

USPTO as ISA for PCT/US14/68857, "International Search Report and Written Opinion", Mar. 4, 2015, 8 pages.

* cited by examiner

*Primary Examiner* — Joseph Schoenholtz
(74) *Attorney, Agent, or Firm* — Patent Law Group LLP; Brian D. Ogonowsky

(57) ABSTRACT

A power MOSFET cell includes an N+ silicon substrate having a drain electrode. A low dopant concentration N-type drift layer is grown over the substrate. Alternating N and P-type columns are formed over the drift layer with a higher dopant concentration. An N-type layer, having a higher dopant concentration than the drift region, is then formed and etched to have sidewalls. A P-well is formed in the N-type layer, and an N+ source region is formed in the P-well. A gate is formed over the P-well's lateral channel and next to the sidewalls as a vertical field plate. A source electrode contacts the P-well and source region. A positive gate voltage inverts the lateral channel and increases the conduction along the sidewalls. Current between the source and drain flows laterally and then vertically through the various N layers. On resistance is reduced and the breakdown voltage is increased.

24 Claims, 49 Drawing Sheets

VERTICAL POWER MOSFET WITH PLANAR CHANNEL AND VERTICAL FIELD PLATE

CROSS REFERENCE TO RELATED APPLICATIONS

This application claims priority from U.S. provisional application Ser. No. 61/935,707, by Jun Zeng et al., filed Feb. 4, 2014, and incorporated herein by reference.

FIELD OF INVENTION

The present invention relates to power MOSFETs and, in particular, to a vertical, super junction MOSFET including a planar DMOS portion and a vertical conduction portion.

BACKGROUND

Vertical MOSFETs are popular as high voltage, high power transistors due to the ability to provide a thick, low dopant concentration drift layer to achieve a high breakdown voltage in the off state. Typically, the MOSFET includes a highly doped N-type substrate, a thick low dopant concentration N-type drift layer, a P-type body layer abutting the drift layer, an N-type source at the top of the body layer, and a gate separated from the body region by a thin gate oxide. It is common to provide a vertical trenched gate. A source electrode is formed on the top surface, and a drain electrode is formed on the bottom surface. When the gate is sufficiently positive with respect to the source, the channel region of the P-type body between the N-type source and the N-type drift layer inverts to create a vertical conductive path between the source and drain.

In the device's off-state, when the gate is shorted to the source or negative, the drift layer depletes and large breakdown voltages, such as exceeding 600 volts, can be sustained between the source and drain. However, due to the required low doping of the thick drift layer, the on-resistance suffers. Increasing the doping of the drift layer reduces the on-resistance but lowers the breakdown voltage.

It is known to form alternating vertical columns of P and N-type silicon, extending to the substrate, instead of a single N-type drift layer, where the charges in the columns are balanced and where the P and N-type columns completely deplete at a high voltage when the MOSFET is off. This is referred to as a super junction. In such a configuration, the dopant concentration of the N-type column can be higher than that of a conventional N-type drift layer. As a result, on-resistance can be reduced for the same breakdown voltage. A super junction MOSFET can be formed by a multiple epitaxial growth and implantation process. Forming thick and alternating P and N-type columns extending to the substrate requires many cycles of epitaxially growing a portion of the column thickness, then masking and implanting the P and N-type dopants, then growing more of the column thickness and repeating the masking and implantation process. The number of implantation steps may exceed twenty, depending on the thickness. Between each implant cycle, the dopants undesirably laterally spread due to the high process temperatures. This greatly increases the required cell pitch in an array of cells, making the die larger. As a result, the MOSFET is not optimally formed and the process is very time-consuming.

Alternatively, a super junction can be formed by etching deep trenches in N-type silicon that are refilled by a P-type epitaxial layer. The trenches must be deep so that there is a sufficiently long vertical drift layer to support a depletion region for a high breakdown voltage. Forming deep trenches is time-consuming and therefore expensive.

Such power MOSFETs are formed to have a large number of identical parallel cells. Any variation between the devices can cause non-uniform currents and temperatures to result across the MOSFET, reducing its efficiency and breakdown voltage.

What is needed is a power MOSFET that does not suffer from the above-described drawbacks and limitations of the prior art.

SUMMARY

In one embodiment, a MOSFET is formed having a planar channel region, for a lateral current flow, and a vertical conduction path for a vertical current flow.

In one embodiment, a P-well (a body region) is formed in an N-type layer, where there is a trench formed in the N-type layer, deeper than the P-well, resulting in vertical sidewalls of the N-type layer. The N-type layer is more highly doped than an N-type drift layer in the MOSFET. The MOSFET includes a shielded vertical field plate formed by a conductive material, such doped polysilicon, filling the trench and insulated from the sidewalls by a dielectric material, such as oxide. A P-shield layer is formed at the bottom of the trench and abuts the bottom portion of the sidewall. The P-shield layer also abuts the top of a P-column. An N-column is below the channel region and laterally abuts the P-column. The N and P columns are relatively highly doped for a low on-resistance. The trench field plate is deeper than the P-well to provide an effective electric field reduction in the N-layer. The field plate and the P-shield help to deplete the N-layer laterally when the MOSFET is off, allowing the N-layer to be relatively highly doped for a low on-resistance. The combined effect of the trench field plate, the P-shield, the N-type layer, a reduced thickness N-type drift layer, and relatively highly doped P and N columns provides an increased breakdown voltage, lower on-resistance, and a lower cost per die. The conducting field plate electrode can be connected to the gate electrode or the source electrode to provide lower gate-drain capacitance for faster switching.

The lower on-resistance per unit area allows more dies to be formed per wafer.

In one preferred embodiment the field plate trench depth, its insulated material thickness, the N-layer doping and thickness and the P-shield doping and depth are chosen such that the N-layer is fully depleted at the breakdown voltage. Furthermore, the P and N column doping, depth and width are such that the P and N columns are fully depleted at the breakdown voltage.

In one embodiment, a power MOSFET includes a highly doped N-type substrate with a low dopant concentration first N-type layer (the drift layer), approximately 30 microns thick, epitaxially grown over the substrate. This first N-type layer is much thinner than the prior art drift layers since it is not required to sustain the entire source-drain voltage in the off state.

The first N-type layer is masked and implanted with dopants to form alternating P and N-type regions, approximately 4 microns thick, which are referred to as columns. The N-type dopant concentration in the N-type columns is much higher than the dopant concentration in the N-type drift layer. Only one implantation for each type dopant needs to be used in one embodiment to form the columns, since the column layer is relatively thin compared to the column layer in the prior art. Therefore, there is less lateral spreading of the dopants compared to the prior art, and the columns are optimized.

Over the column layer is formed a second N-type layer, such as 8 microns thick, having a dopant concentration higher than that of the first N-type layer.

Within the second N-type layer is formed a P-well and within the P-well is formed an N-type source region at the surface. The top surface of the P-well between the source region and the top of the second N-type layer forms a lateral channel along the top surface of the device.

A trench is etched in the second N-type layer between the P-wells in each cell and is deeper than the P-wells. A thin gate dielectric is then formed over the top lateral channel and along the sidewall of the trench. A polysilicon gate is then formed over the top channel and along the vertical sidewall of the trench to a depth deeper than the P-well. The dielectric layers separating the gate from the channel and the sidewall may have the same thickness or different thicknesses for different advantages. The trench field plate results in a lower electric field and a higher breakdown voltage, which allows the increase of the doping of the second N-type layer thus lowering the on-resistance.

A metal source electrode contacts the P-well and the source regions, and a metal drain electrode contacts the bottom surface of the substrate.

In another embodiment the P-columns can be formed during the same step of forming P-shield by using single or multiple high energy implantations.

In one example, a load is coupled between the source electrode and ground, and a positive voltage is applied to the drain. When the gate is sufficiently biased positive with respect to the source electrode, the top lateral channel between the source region and the second N-type layer inverts, and electrons accumulate along the vertical sidewall of the trench in the second N-type layer. This lateral and vertical accumulation of electrons forms a low resistance path between the source and the N-type column below the channel. The N-type column and first N-type layer then complete the vertical conductive path to the drain electrode.

Since there is no thick, low-dopant-concentration drift region between the channel and the drain electrode, the on-resistance per unit area (specific on-resistance Ron*Area) is lower than that of the conventional vertical power MOSFET. The on-resistance is lower due, in part, to the use of the higher-dopant-concentration N-column and second N-type layer, as well as the higher doping of the second N-type layer, where the higher doping of the second N-type layer is enabled by the trench field plate effect, the P-shield, and the accumulation of electrons along the vertical sidewall of the second N-type layer when the gate is positively biased. In one embodiment the specific on-resistance achieved is 4.5 Ohms-mm$^2$, which is about half that of a conventional power MOSFET.

Due to the much lower on-resistance per unit area, the die size may be smaller than prior art die sizes, resulting in double the number of dies per wafer for the same on-resistance per die.

In the MOSFET's off state, and with a source-drain voltage slightly lower than the breakdown voltage, the first N-type layer, the columns, and the second N-type layer completely deplete. The breakdown voltage may be the same as the prior art vertical MOSFETs having the same thickness, but the on-resistance is less. Conversely, the breakdown voltage may be increased above the prior art breakdown voltage by forming thicker layers, while the on-resistance may be the same as the prior art. Further, the processing complexity for the resulting vertical MOSFET is much less than the processing complexity for the prior art vertical MOSFETs having a super junction due to the thinner column layer and the shallower trench.

The MOSFET structure also lowers the recovery time after the PN diode in the MOSFET is biased on. If the MOSFET is used with an alternating voltage, the diode will conduct when the drain is more negative than the source. When the polarity reverses and the diode is reverse biased, there is a stored charge that must be removed prior to the MOSFET being fully turned on after the gate is biased to an on state. Since there is a higher dopant level in the second N-type layer and the N-column, this stored charge is removed faster, enabling a faster switching time.

In a preferred embodiment, a P-type shield layer is formed above the P-columns under the trench so as to abut the sidewall of the second N-type layer. This P-type shield layer helps to laterally deplete the second N-type layer to increase the breakdown voltage.

Gate configurations are described that also help to laterally deplete the second N-type layer to increase the breakdown voltage.

Many variations of the above described cell using a top lateral channel, a vertical field plate facing an enhanced vertical "channel" portion, and a super junction are described. Inventive techniques for forming the vertical MOSFETs are also described.

An insulated gate bipolar transistor (IGBT) may instead be formed by using a P-type substrate.

BRIEF DESCRIPTION OF DRAWINGS

Elements that are the same or equivalent in the various figures are labeled with the same numeral.

DETAILED DESCRIPTION

Figure 1:
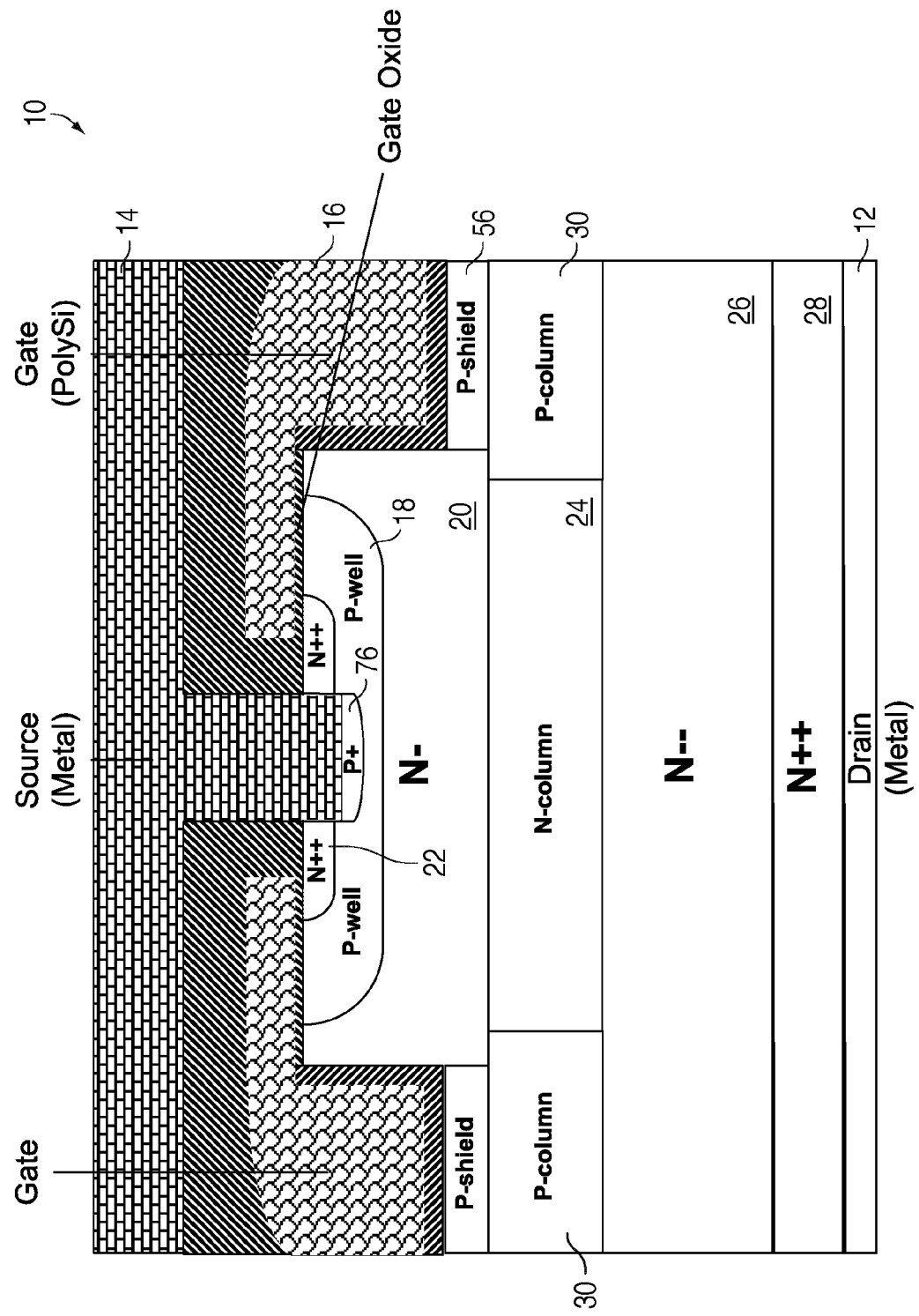
FIG. 1 is a cross-sectional view of a single vertical MOSFET cell in a large array of identical contiguous MOSFET cells in accordance with one embodiment of the invention.

FIG. 1 is a cross-sectional view of a single vertical MOSFET cell 10 in a large array of identical contiguous MOSFET cells in accordance with one embodiment of the invention. The width of the cell shown is about 8-11 microns. The MOSFET cell 10 may have a breakdown voltage exceeding 600 volts, and the number of cells 10 in an array of identical cells determines the current handling ability, such as 20 Amps. The array of cells may be in strips, squares, hexagons, or other known shapes.

During normal operation, a positive voltage is applied to the bottom drain electrode 12 and a load is connected between ground and the top source electrode 14. When a positive voltage is applied to the conductive gate 16 that is greater than the threshold voltage, the top surface of the P-well 18 is inverted and electrons accumulate along the vertical sidewalls of the N− layer 20. The gate extends along the sidewalls below the P-well 18 and creates a field plate to lower an electric field in the N− layer 20. The N++ source region 22, the P-well 18, and the N− layer 20 top surface form a lateral DMOS transistor portion of the MOSFET 10. Therefore, in the on-state, there is a conductive N-type channel between the source electrode 14 and the drain electrode 12 via the N++ source region 22, the inverted channel of the P-well 18, the sidewalls of the N− layer 20, the N-column 24 under the channel, the N−− layer 26 (the drift layer), and the N++ substrate 28.

The combination of the lateral DMOS transistor portion, the higher doping of the N layer 20 (allowed by the trench field plate effect and the vertical gate portion accumulating electrons along the sidewall of the N− layer 20), the alternating highly doped N and P-type columns 24 and 30, and the N−− layer 26 reduce the on-resistance compared to the prior art, as later described. This structure also increases the breakdown voltage compared to the prior art and speeds up the switching time if the MOSFETs internal PN diode becomes forward biased, as later described.

Figure 3:
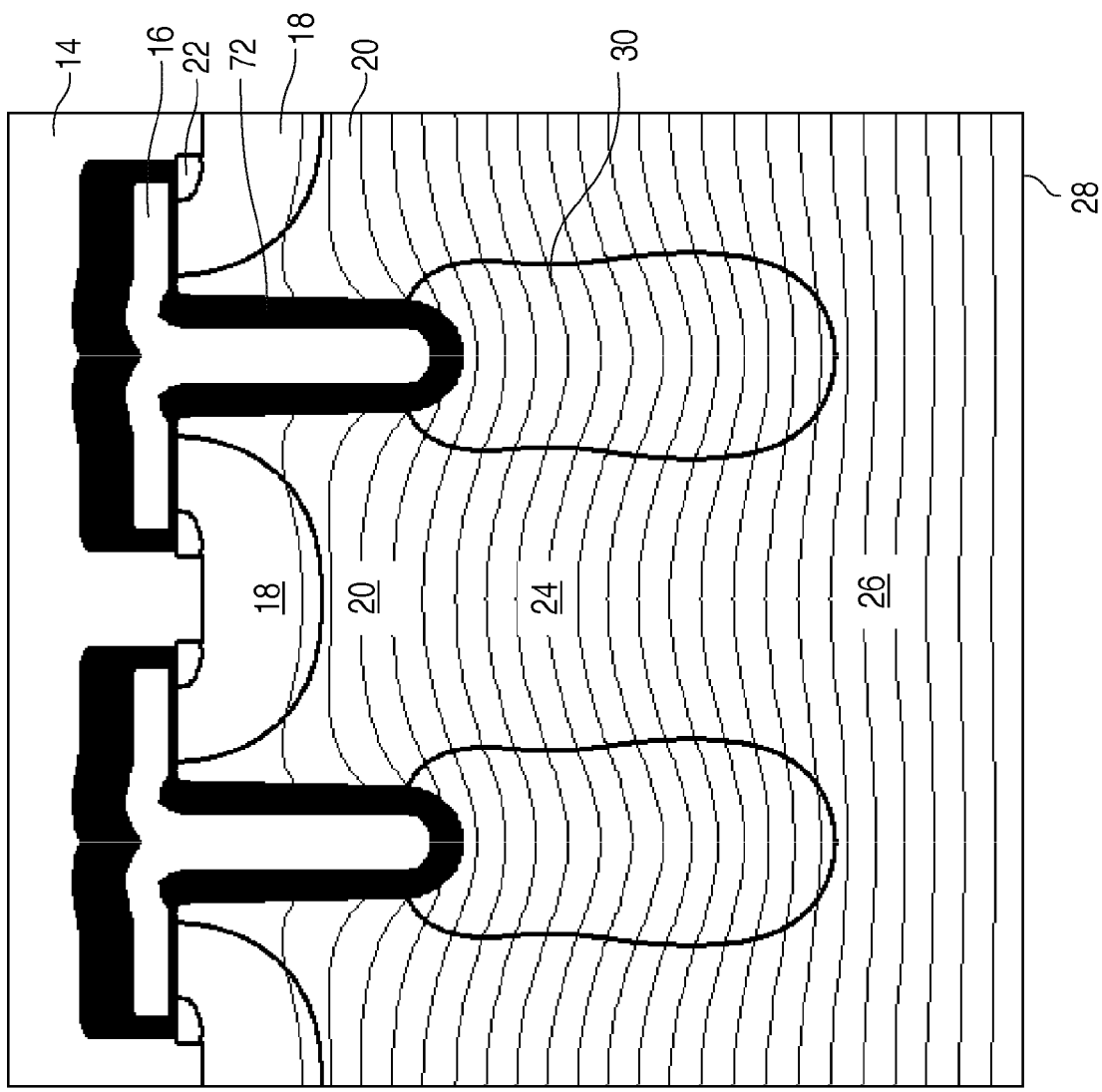
FIG. 3 illustrates equi-potential contours in a depletion region between the substrate top surface and a P-well of the device in an off state, illustrating a virtual maximization of breakdown voltage.

In the cross-sectional views, the depth of the P-well 18 is exaggerated for ease of illustration, and the polysilicon gate 16 along the sidewall of the N− layer 20 extends below the P-well 18. For example, the polysilicon gate 16 along the sidewall of the N− layer 20 (and any other vertical field plate along the sidewall) may extend 1-4 microns below the P-well 18. FIG. 3 illustrates more accurate relative dimensions of the gate 16 relative to the P-well 18 since FIG. 3 is from a simulation.

Figure 2A:
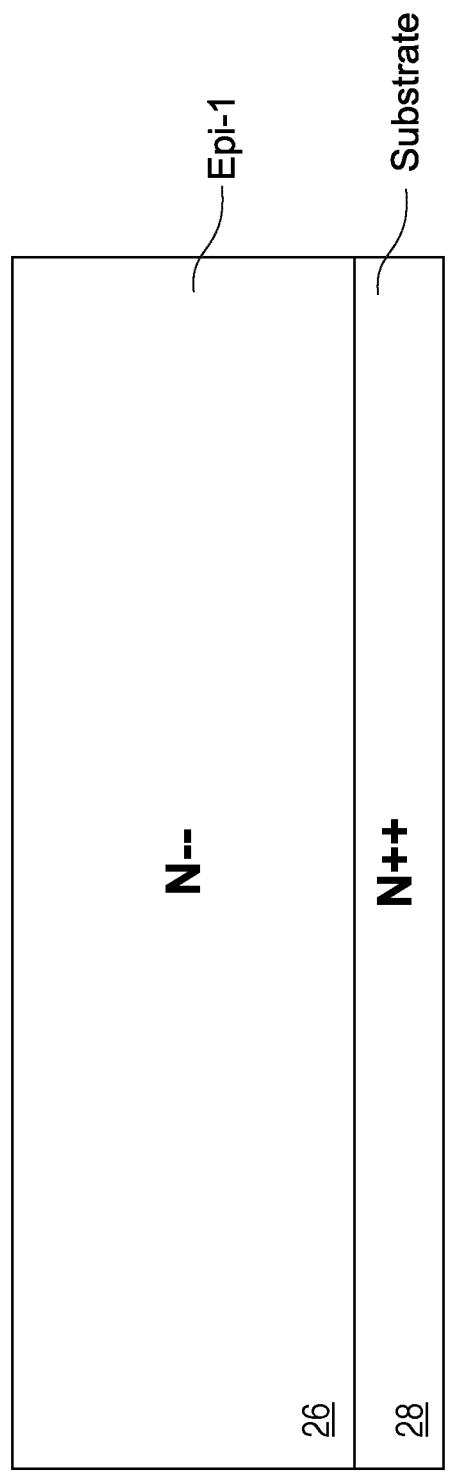
FIGS. 2A-2R illustrate various steps used to fabricate the MOSFET of FIG. 1.
Figure 2B:
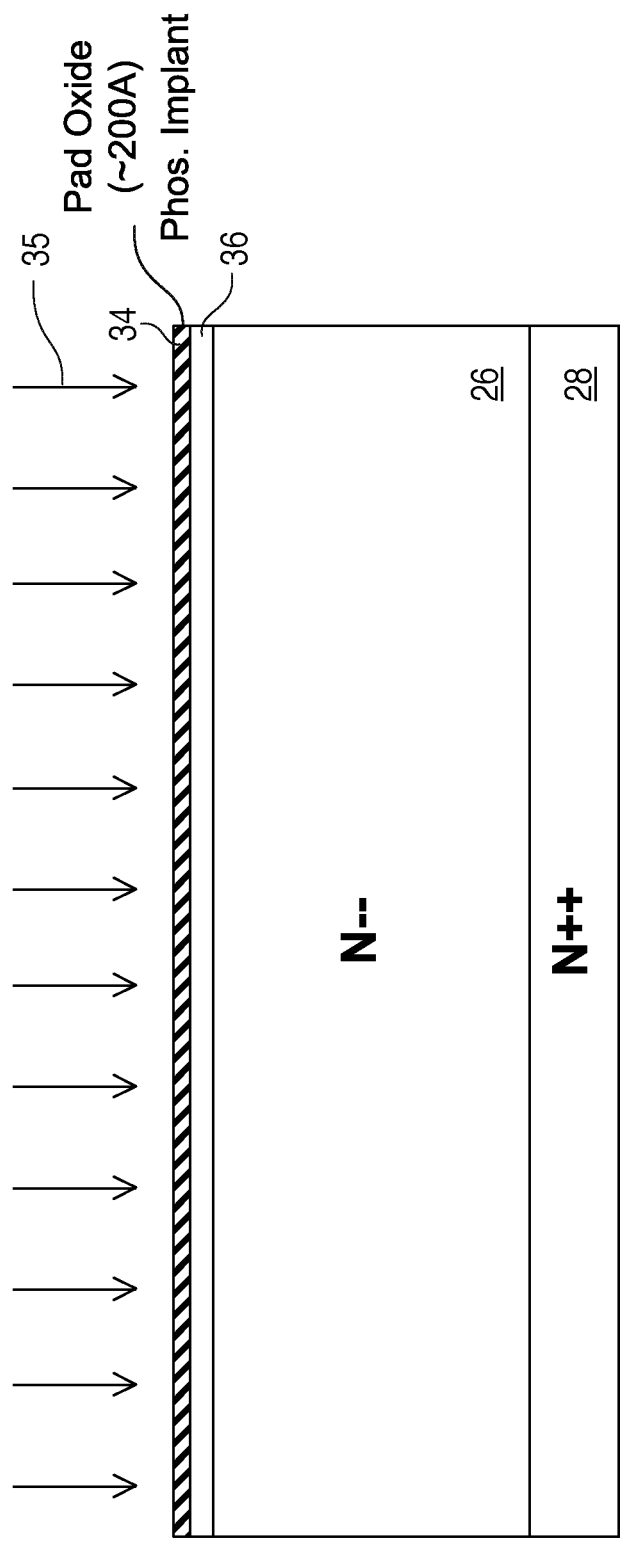
Figure 2C:
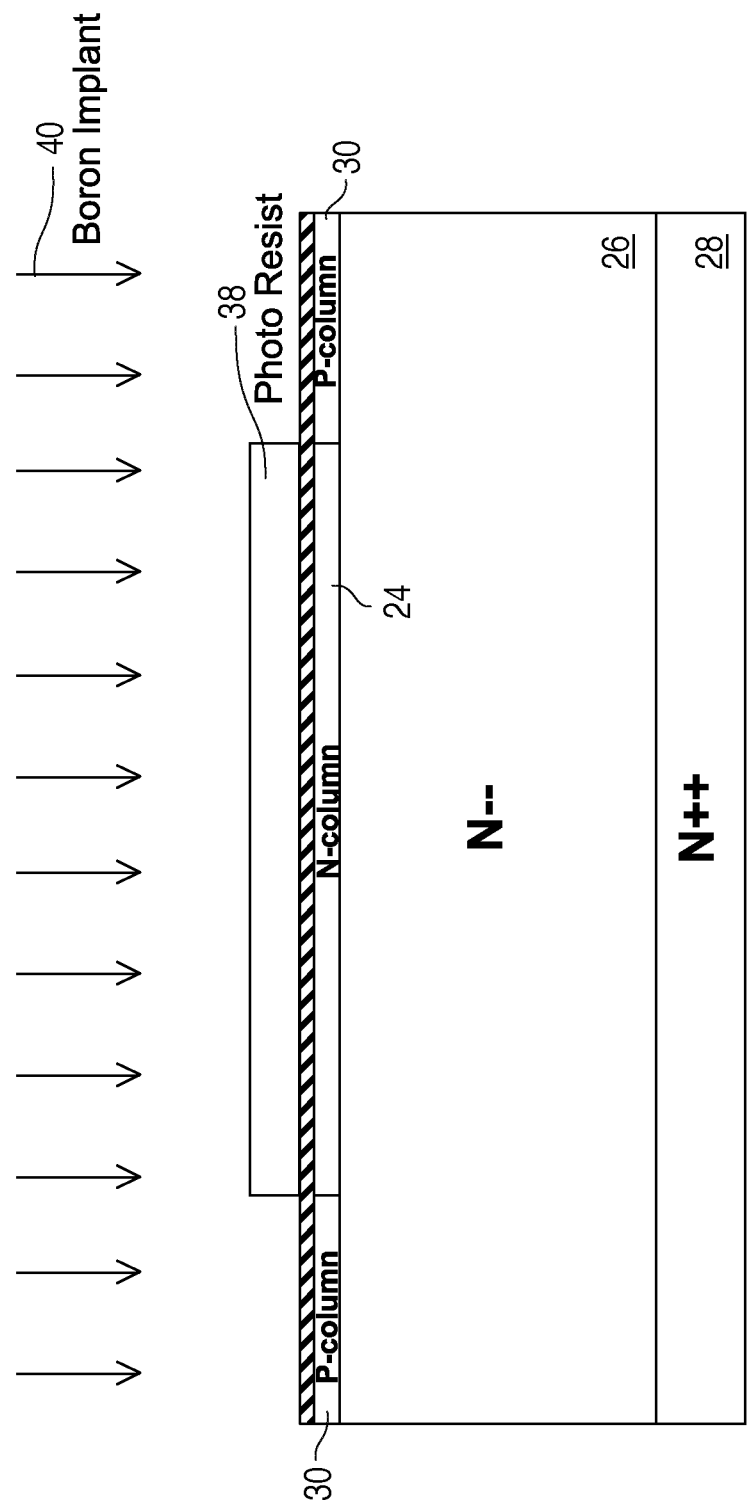
Figure 2D:
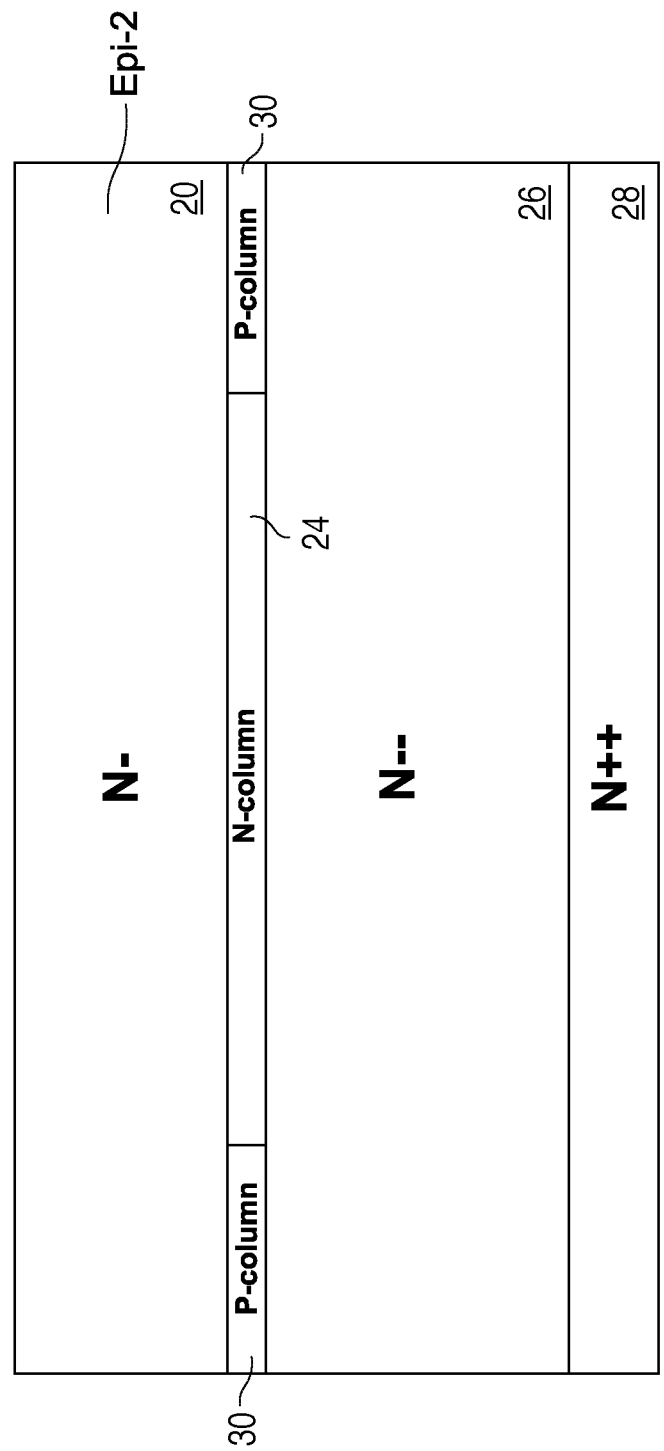
Figure 2E:
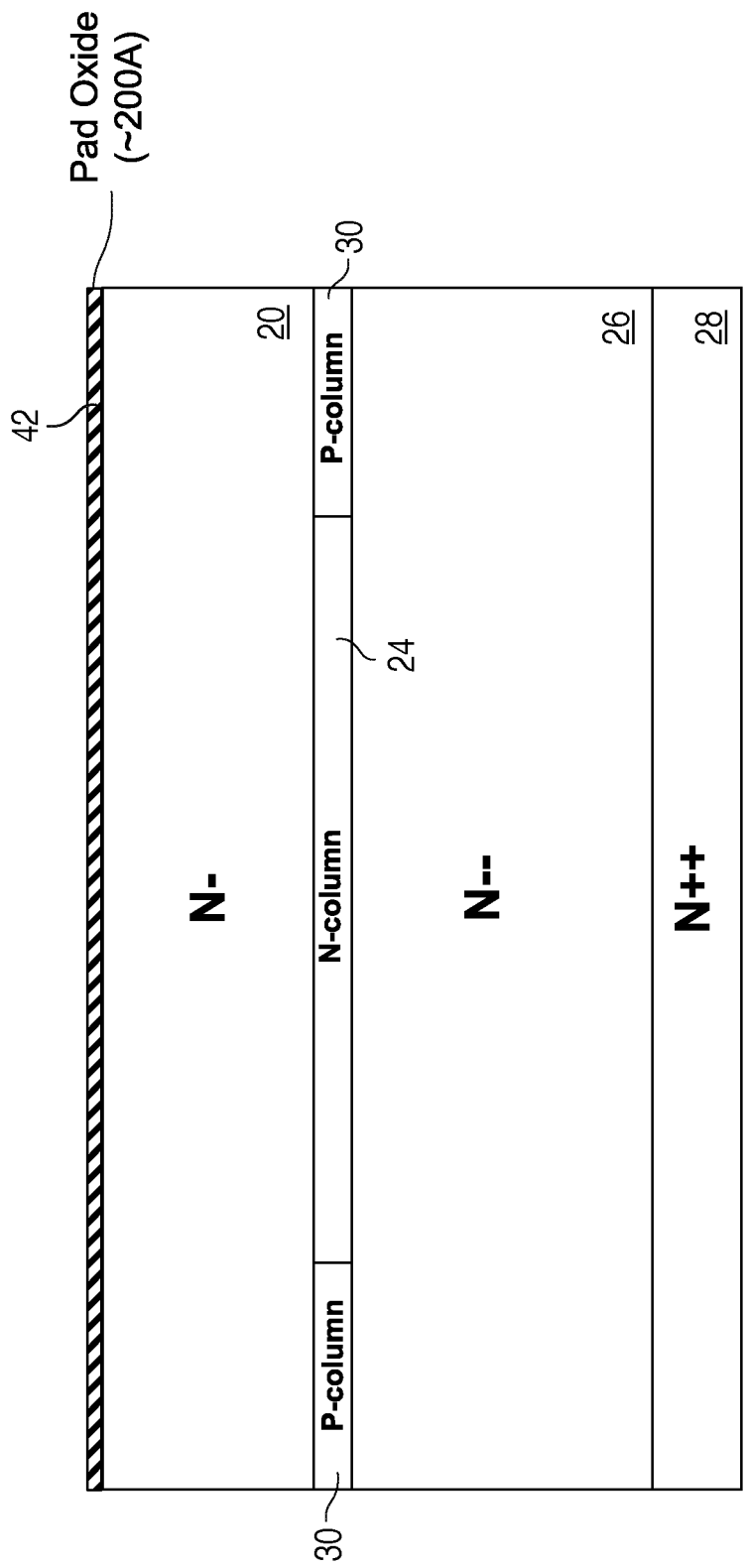
Figure 2F:
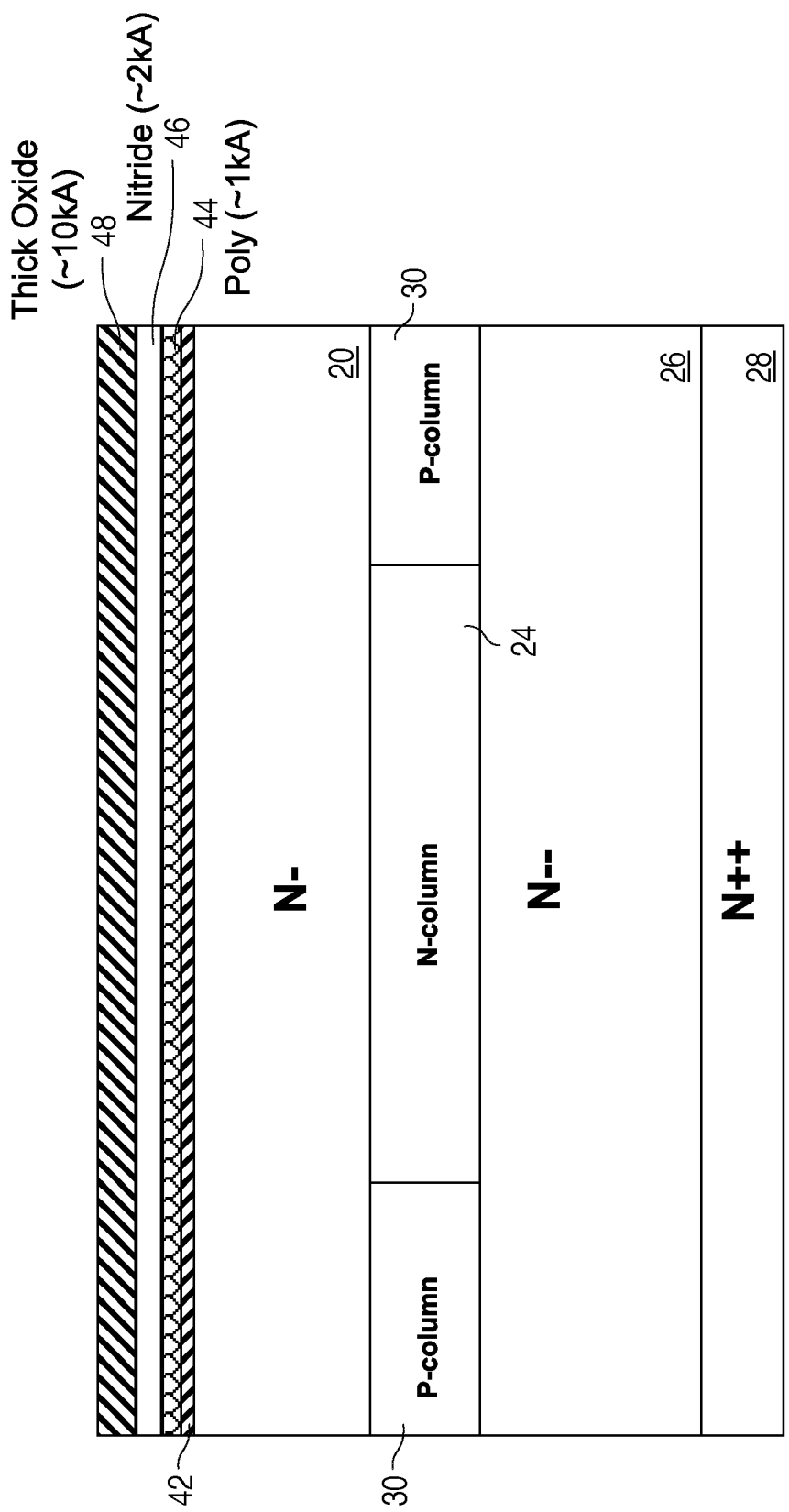
Figure 2G:
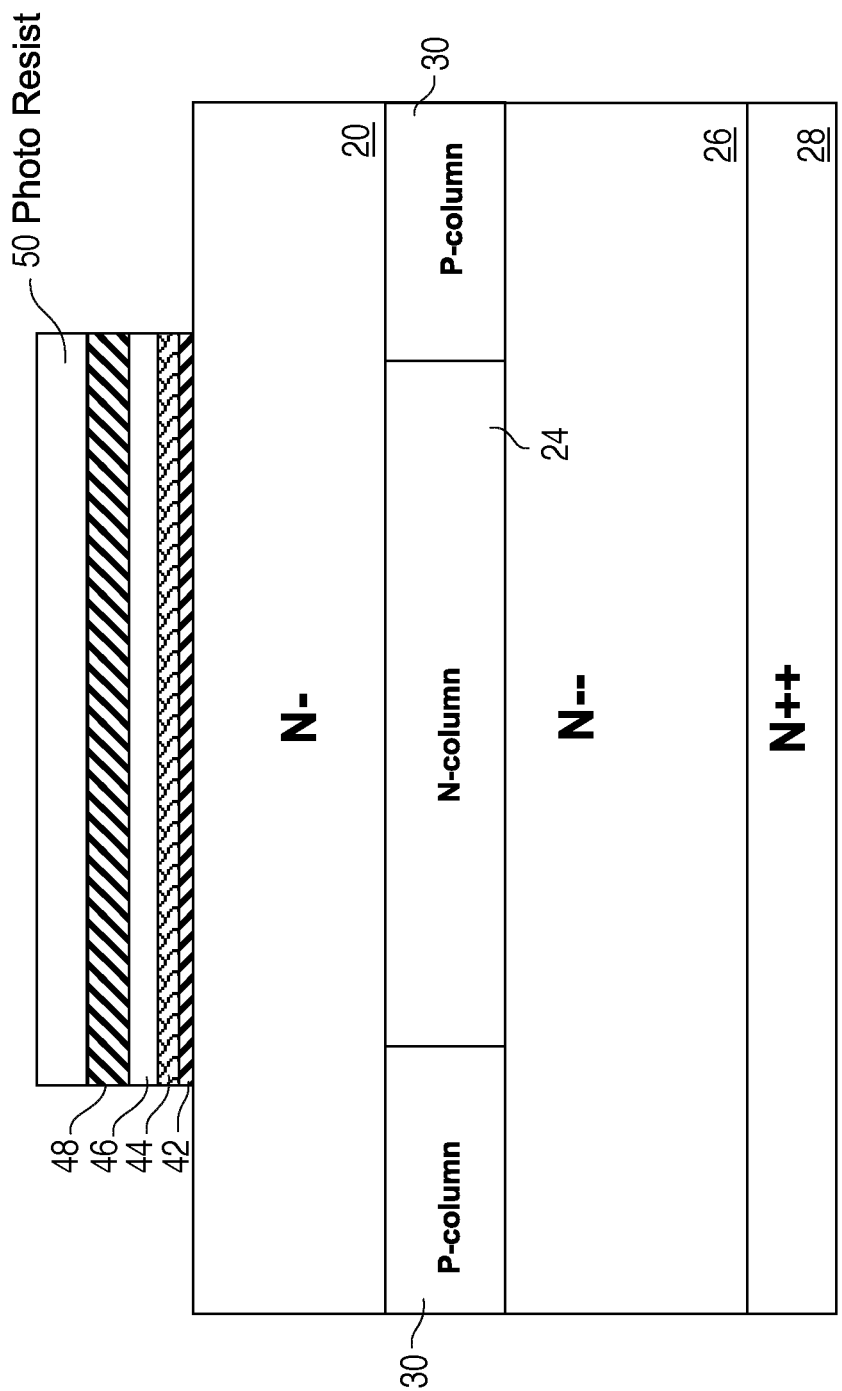
Figure 2H:
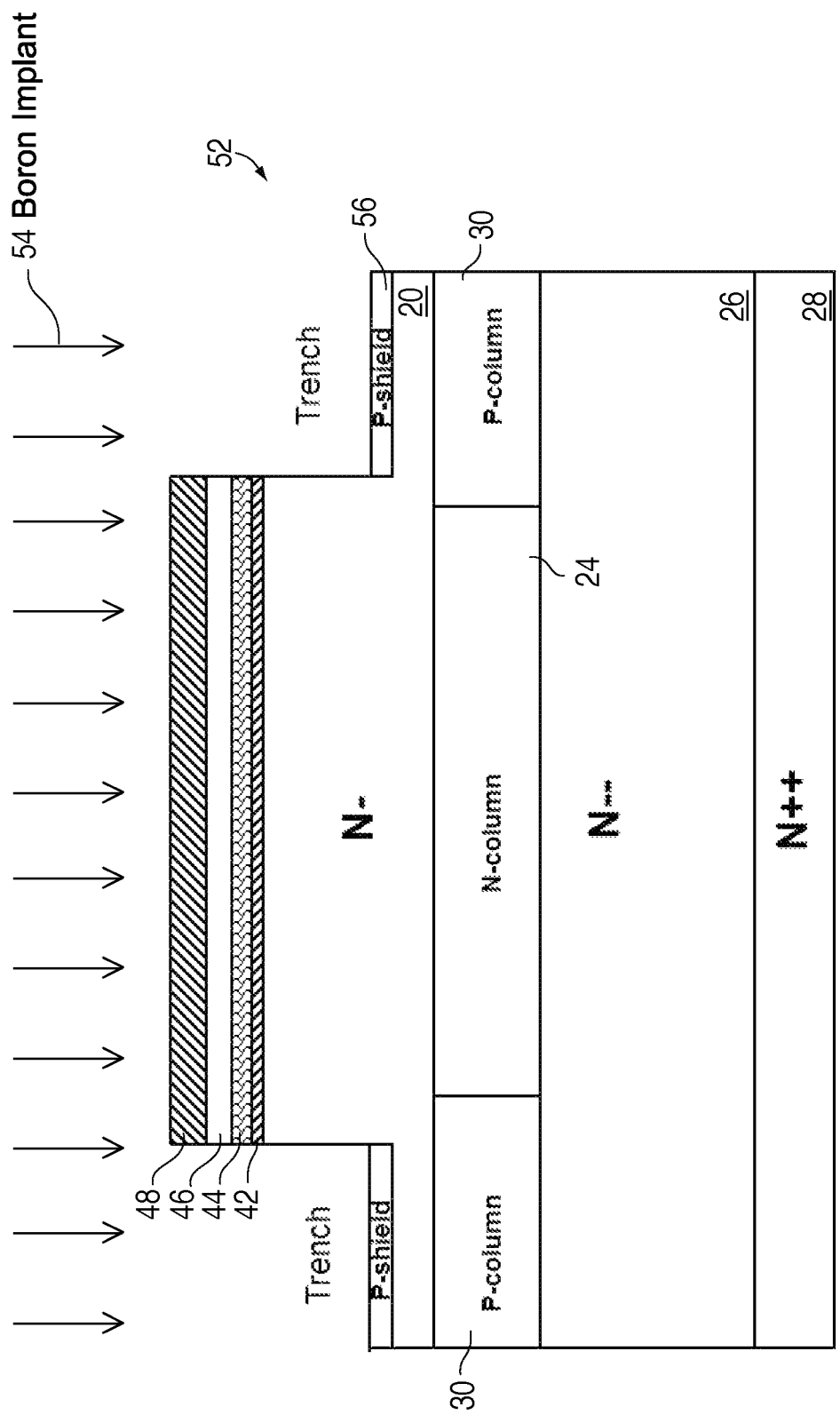
Figure 2I:
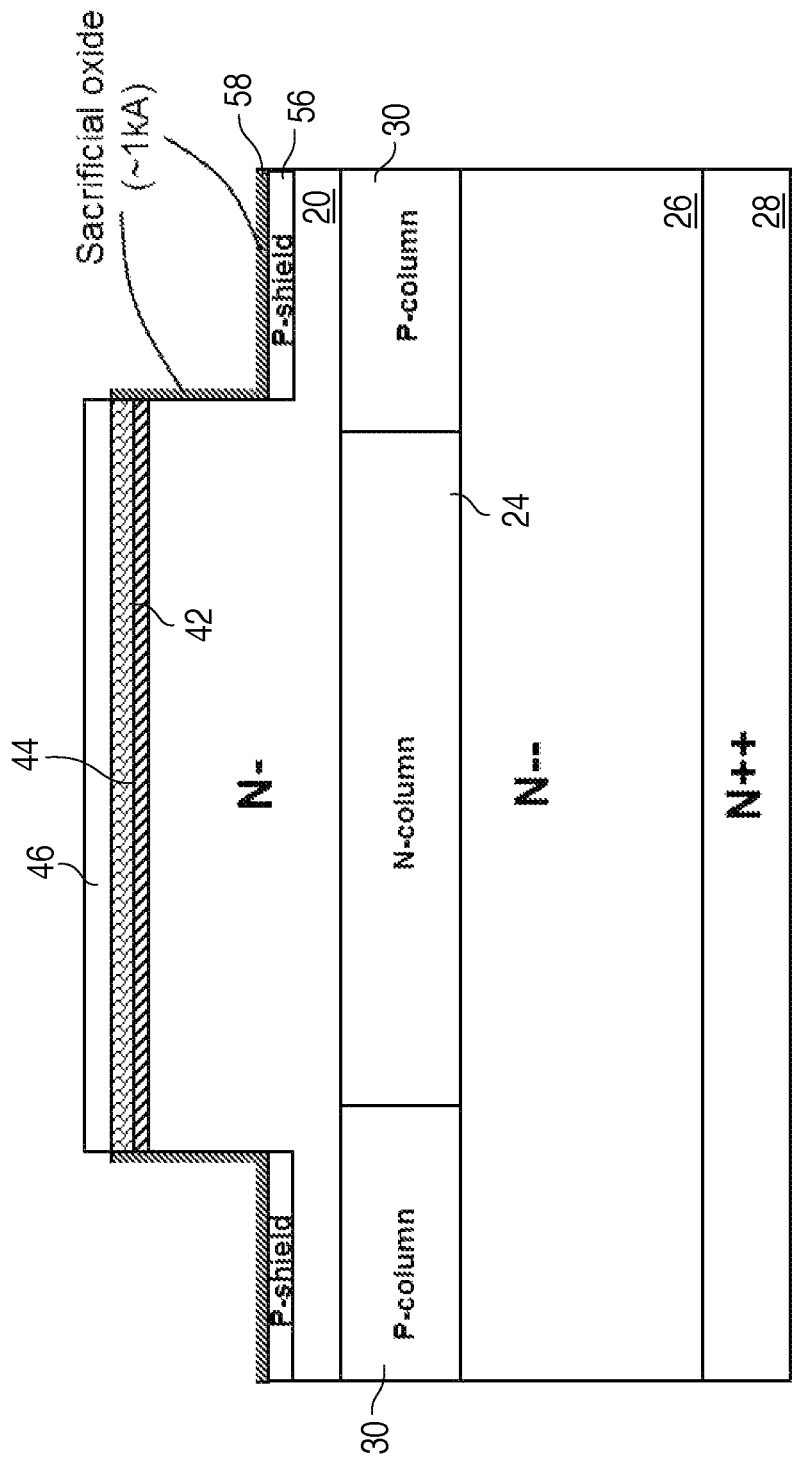
Figure 2J:
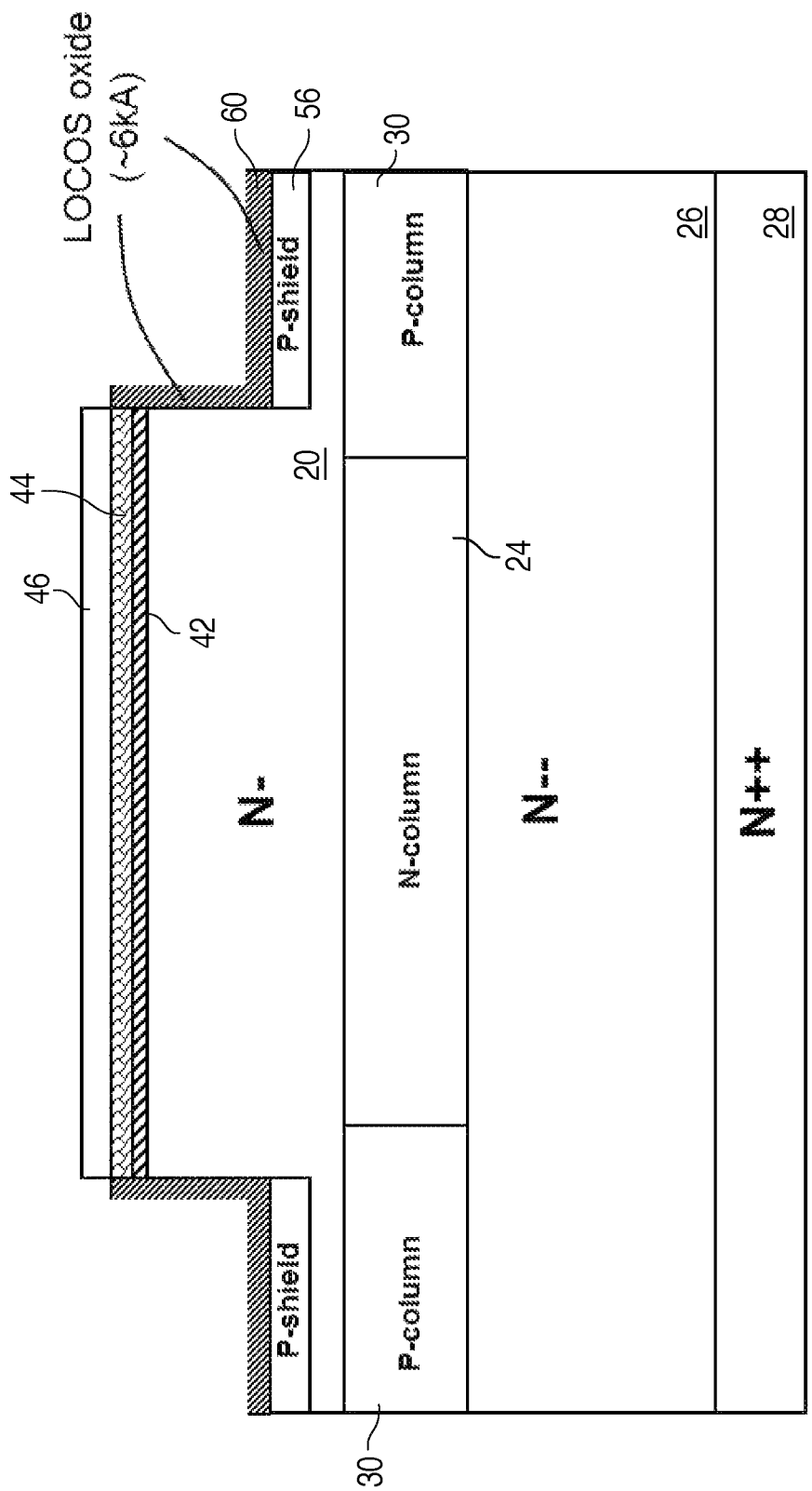
Figure 2K:
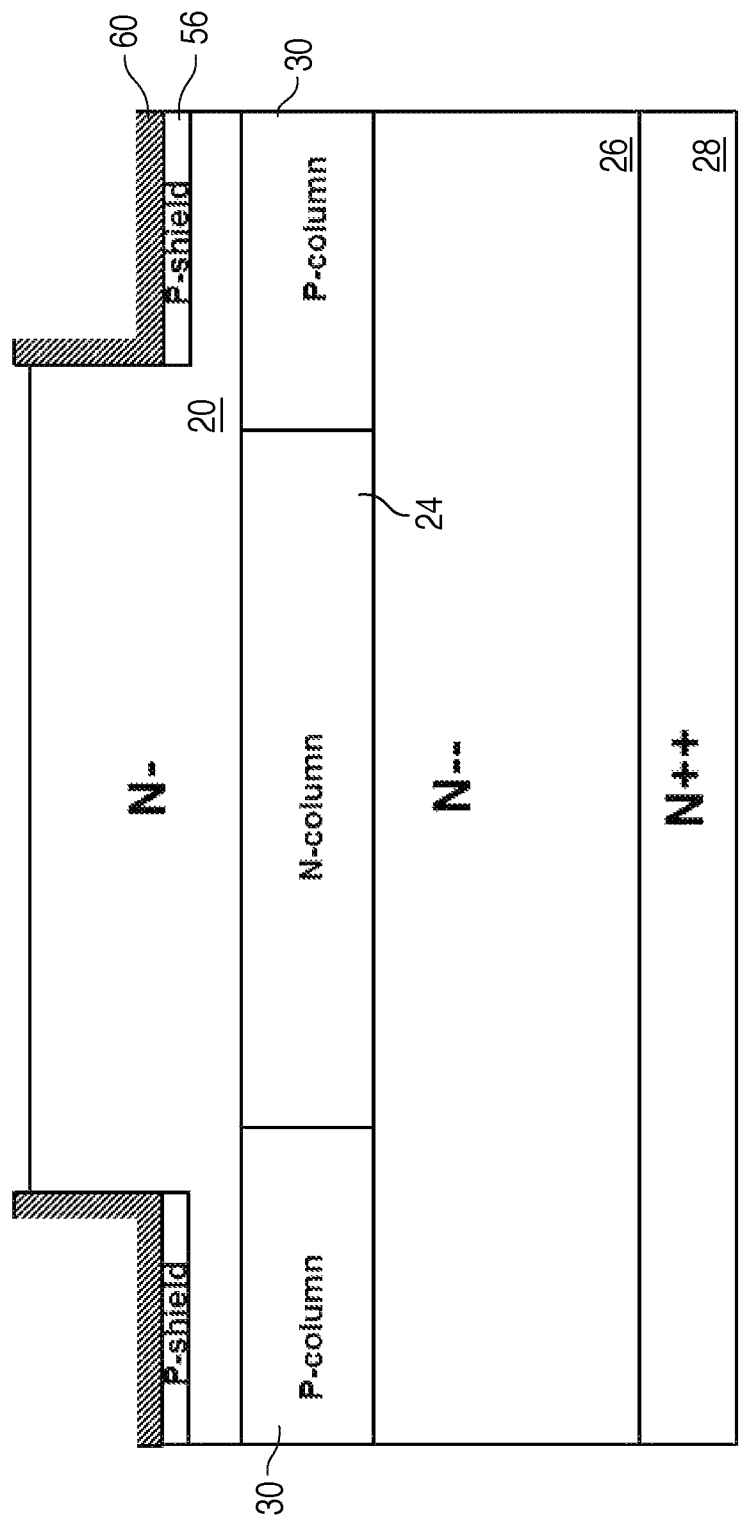
Figure 2L:
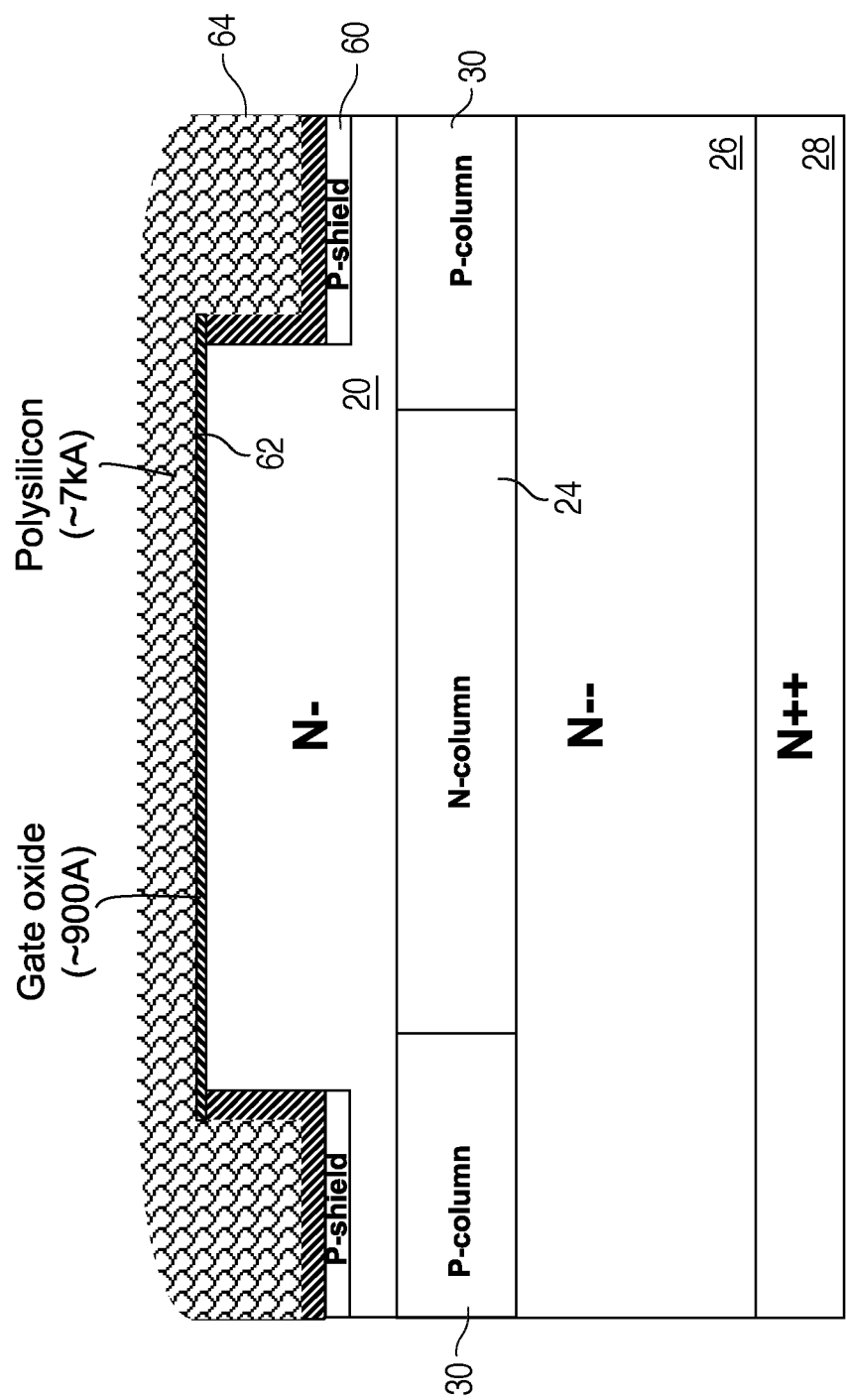
Figure 2M:
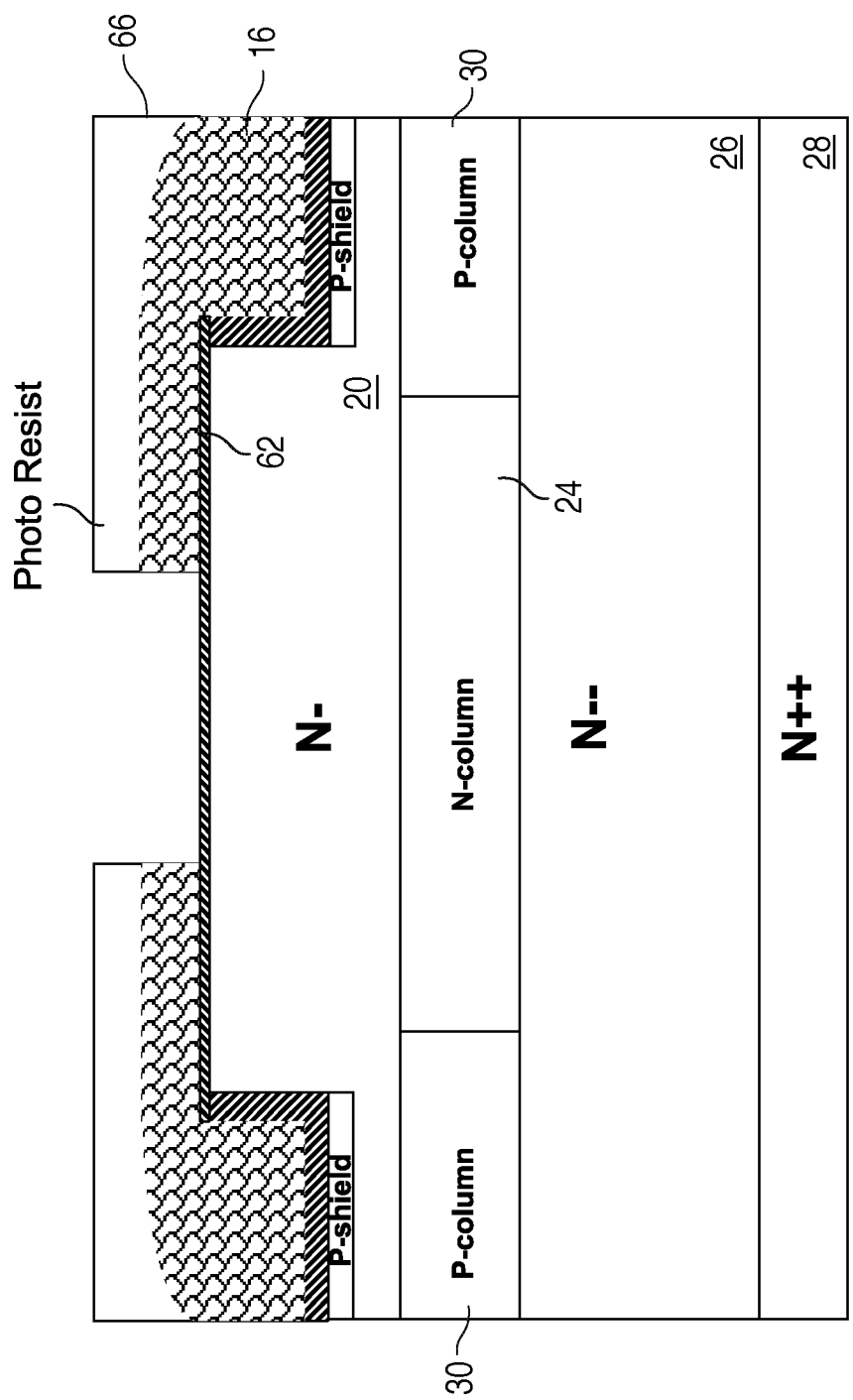
Figure 2N:
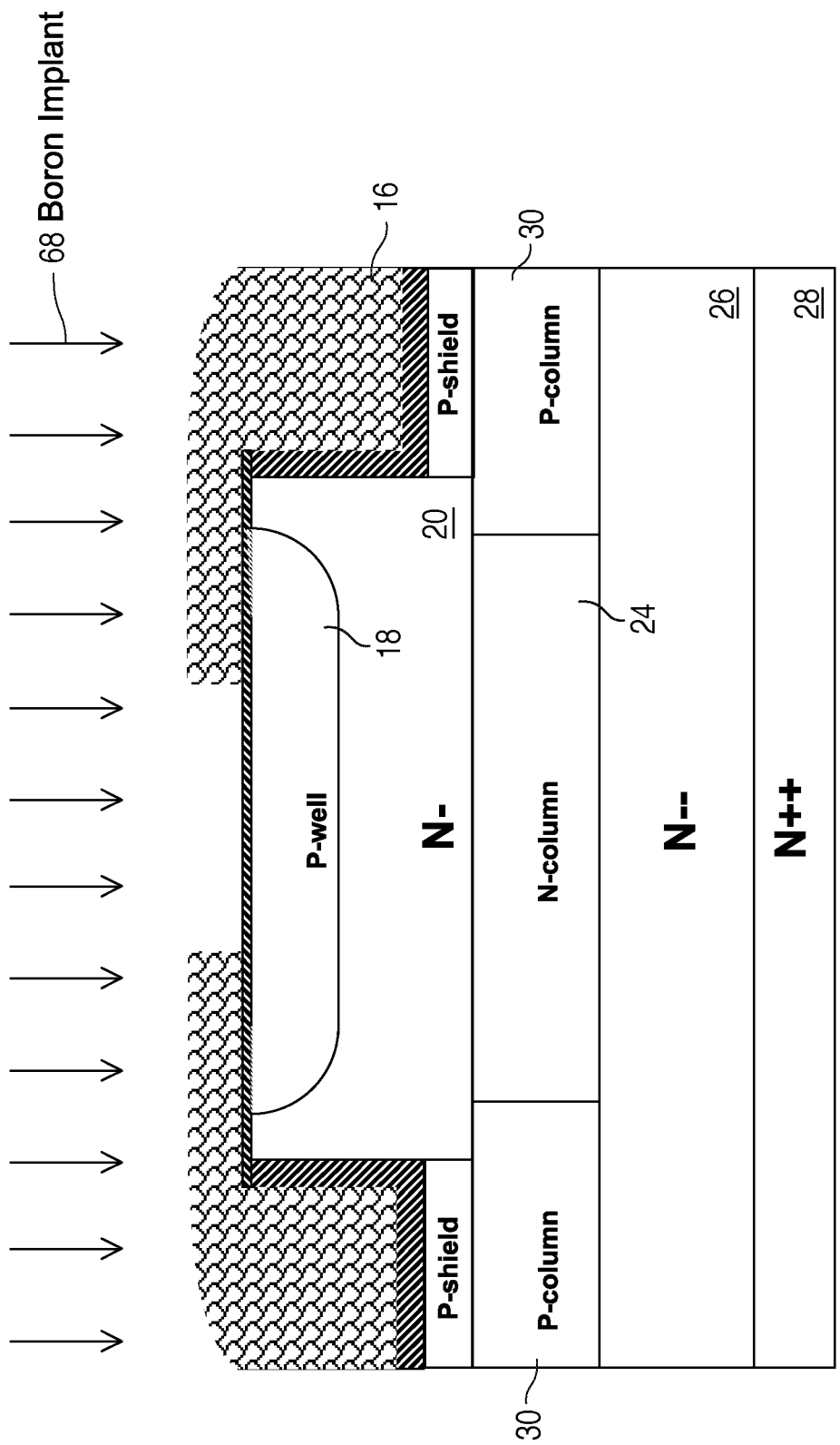
Figure 2O:
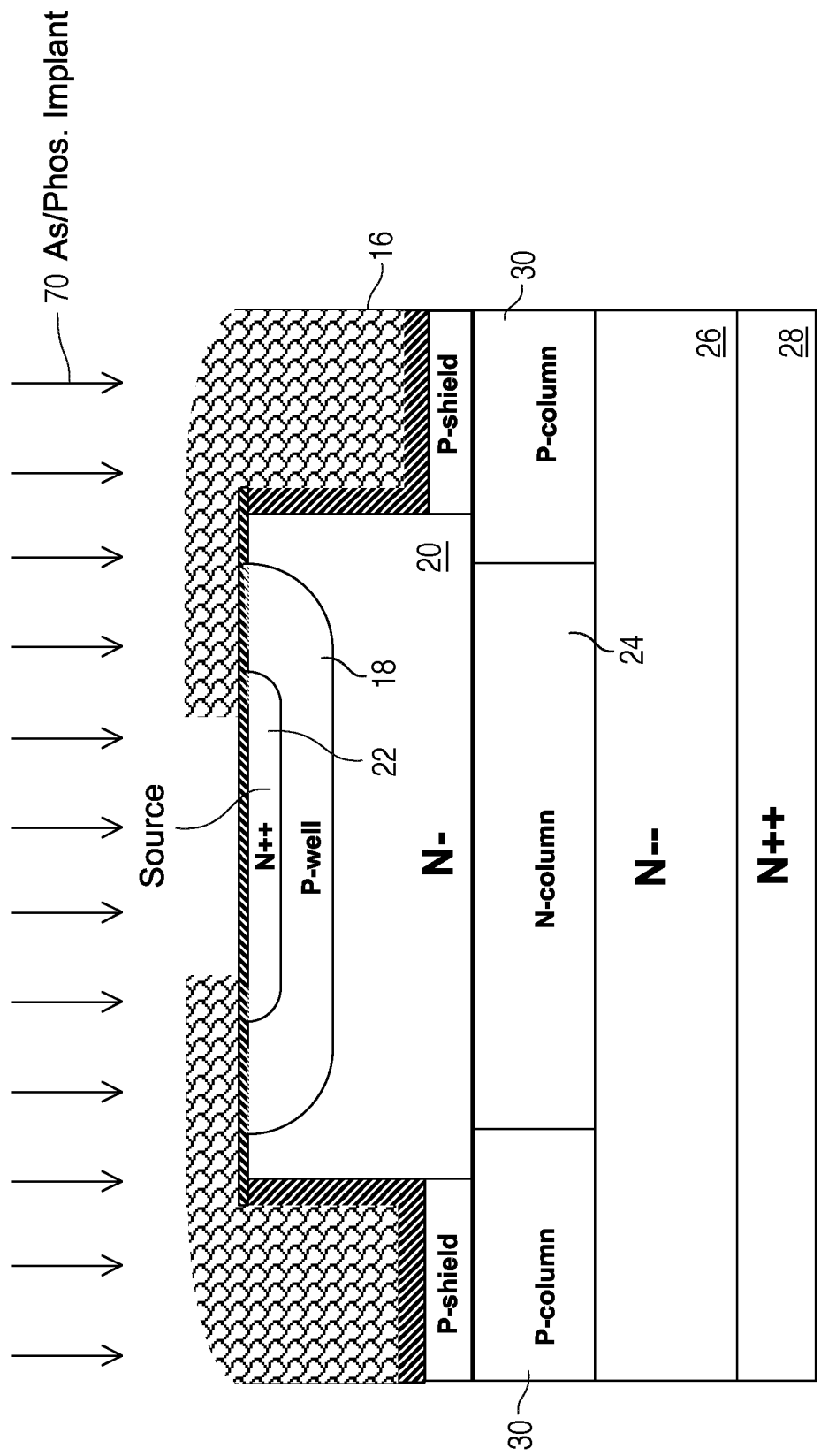
Figure 2P:
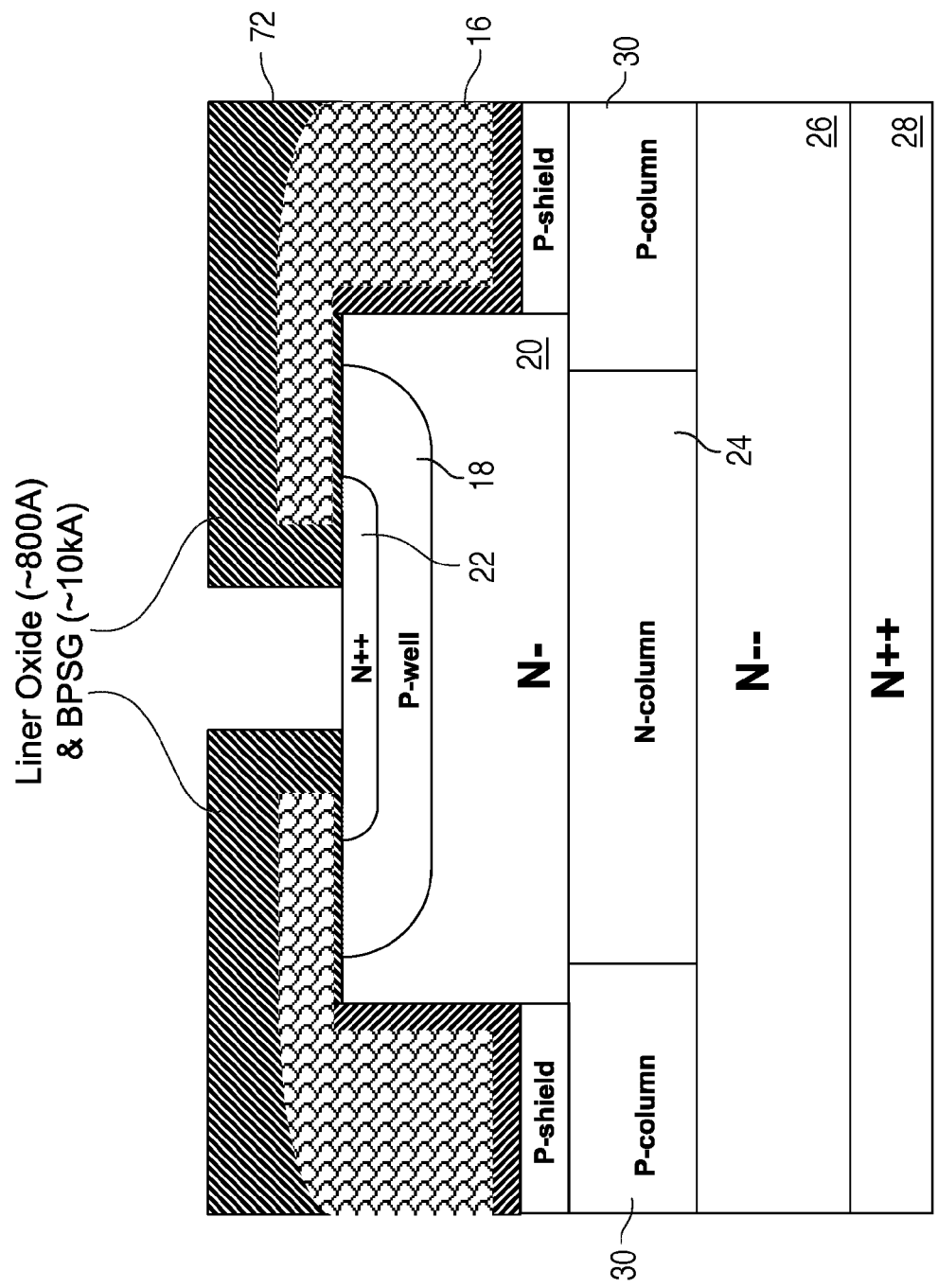
Figure 2Q:
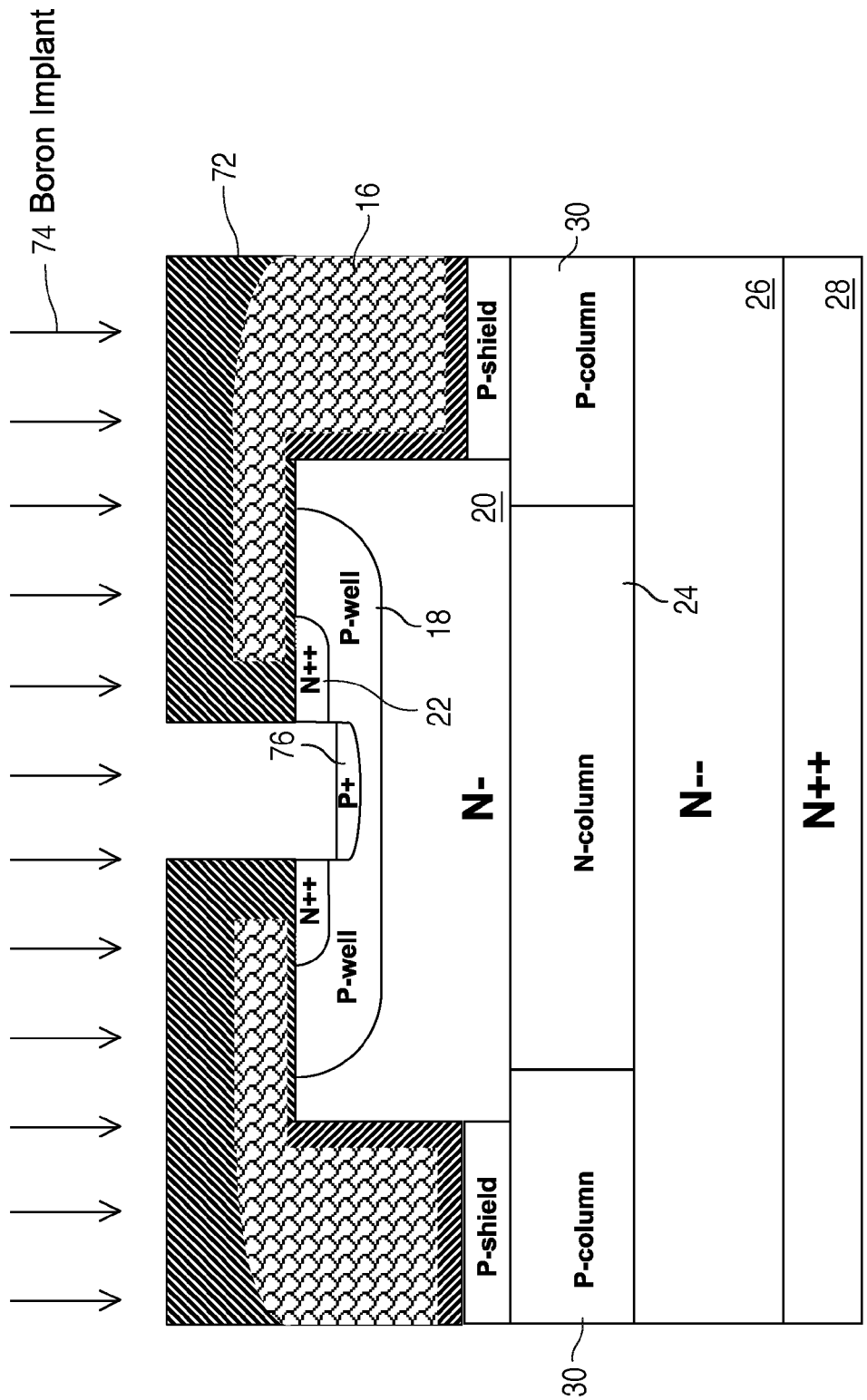
Figure 2R:
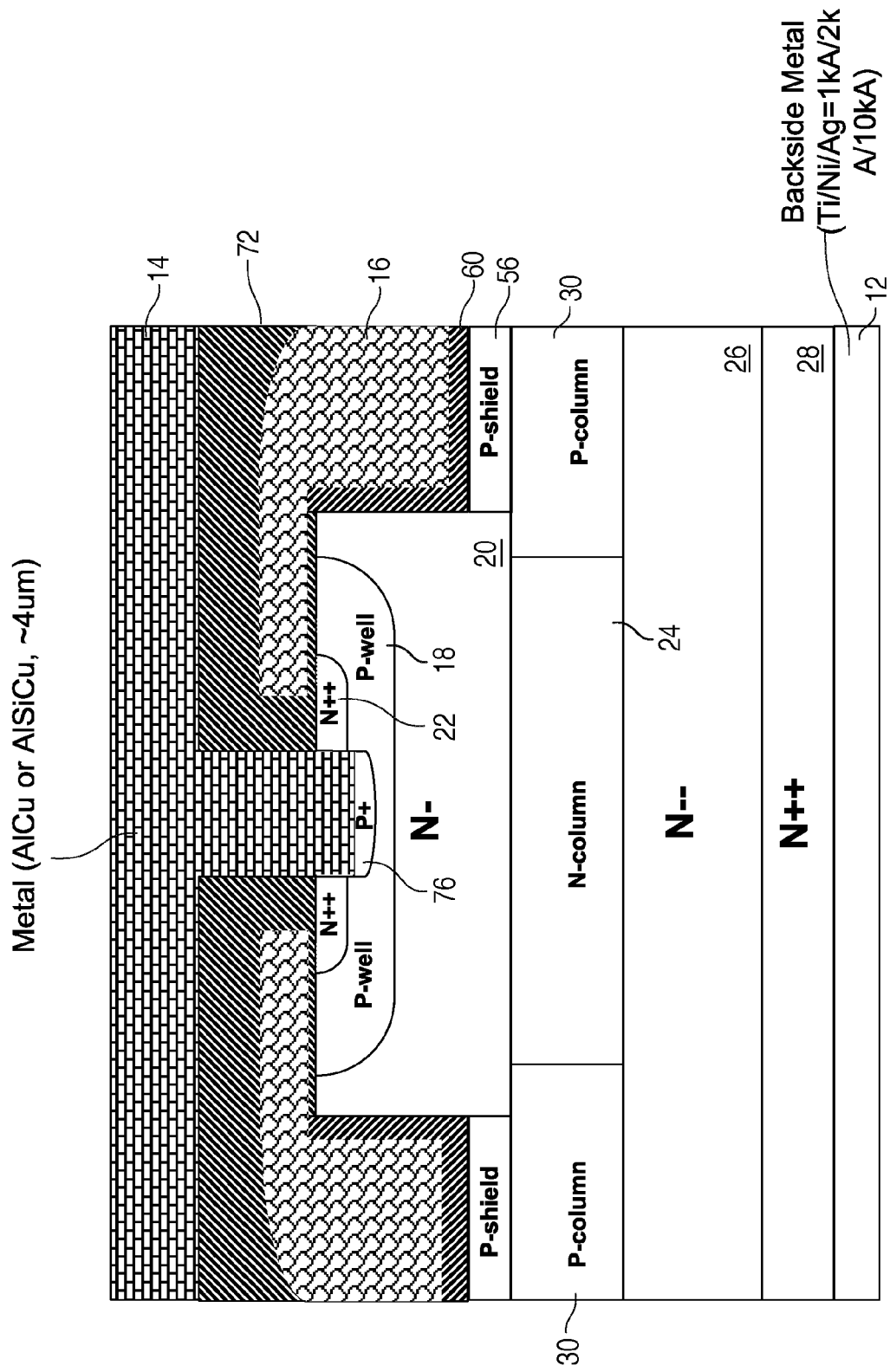

FIGS. 2A-2R illustrate various steps used to fabricate the MOSFET 10 of FIG. 1.

FIG. 2A illustrates the N−− layer 26 being epitaxially grown over an N++ silicon substrate 28 while being doped in-situ during growth, or the N−− layer 26 is periodically implanted with N-type dopants at a dosage of about $1.5E12$ cm$^2$. The substrate 28 may have a dopant concentration of about $5E19$ cm$^3$. The final dopant density in the N−− layer 26 is about $3.5E14$ cm$^3$ for a device with about a 600V breakdown voltage. The N−− layer 26 may be 30 microns thick.

FIG. 2B illustrates a thin thermal oxide layer 34 grown over the N−− layer 26, followed by a blanket phosphorus 35 implant to form an N-column layer 36. The implant dosage may be about $1-2E12$ cm$^2$.

FIG. 2C illustrates a patterned photoresist layer 38 formed over the intended location of the N-columns 24. Boron 40 is then blanket implanted at a dosage of about $1E13$ cm$^2$ to form P-columns 30.

In FIG. 2D, the photoresist and oxide are stripped and an N− layer 20 is epitaxially grown to have a dopant density of about $2.3E15$ cm$^3$, which is higher than the dopant density in the N−− layer 26. The N− layer 20 is about 8 microns thick. In another embodiment, the dopant density in the N− layer 20 is the same as that in the N−− layer 26.

In FIG. 2E, a thermal oxide layer 42 is grown over the N− layer 20. The dopants in the N and P-columns 24 and 30 are driven in and diffuse to form a column layer about 4-5 microns thick, with an N-type dopant concentration in the N-columns 24 of about $2E15$ cm$^3$, and a P-type dopant concentration in the P-columns 30 of about $1E16$ cm$^3$. The dopant density in the N-columns 24 may be greater than that of the N− layer 20 or less.

In FIG. 2F, a polysilicon layer about 1000 Angstroms thick is formed, followed by a nitride layer 46 about 2000 Angstroms thick, followed by a thick oxide layer 48 about 10,000 Angstroms thick.

In FIG. 2G, a layer of photoresist 50 is patterned and the exposed portions of the layers 42, 44, 46, and 48 are etched away.

In FIG. 2H, the photoresist is stripped and a dry etch is performed on the exposed silicon to form trenches 52 in the N-layer 20. The trench etch leaves about 3-4 microns of the N− layer 20 below the trench 52. Next, boron 54 is implanted in the trenches 52 at a dosage of about $4E12$ cm$^2$ to form P-shields 56.

In FIG. 2I, the thick oxide layer is stripped by dry etching, and a thermal sacrificial oxide layer 58 about 1000 Angstroms thick is grown over the P-shield 56 and over the sidewalls of the N− layer 20.

In FIG. 2J, the sacrificial oxide layer is stripped, and an oxide layer 60 about 6000 Angstroms thick is formed, using a LOCOS process, over the P-shield 56 and over the sidewalls of the N− layer 20.

In FIG. 2K, the layers 42, 44, and 46 are stripped off.

In FIG. 2L, a thin gate oxide layer, having a thickness of about 900 Angstroms, is grown over the N− layer 20. A conductive polysilicon layer 64 is then deposited and patterned In FIG. 2M, a photoresist layer 66 is patterned to expose a center portion of the polysilicon layer 64, followed by a dry etch to form the gate 16.

In FIG. 2N, the photoresist layer is stripped, and boron 68 is implanted into the N-layer 20, and driven in to form the P-well 18, having a depth of about 2-3 microns, self-aligned with the gate 16.

In FIG. 2O, arsenic or phosphorus 70 is implanted at a dosage of about 5E15 $cm^2$ and driven in to form an N++ source region 22 about 0.2-0.5 microns deep, self-aligned with the gate 16.

In FIG. 2P, an insulating layer 72 is deposited over and around the gate 16 consisting of a liner oxide layer, having a thickness of about 800 Angstroms, followed by a BPSG layer, having a thickness of about 10,000 Angstroms. The center portion of the insulating layer 72 is then masked with photoresist and etched to expose the N++ source region 22. The photoresist is then stripped.

In FIG. 2Q, the exposed portion of the N++ source region 22 is etched through to expose the P-well 18. Boron 74 is then implanted at a dosage of about 2E15 $cm^2$ and driven in to form a P+ contact region 76 in the P-well 18. The lateral width of the P+ contact region 76 is about 1 micron. If the P-well 18 extends to the edge of the die, the P+ contact region 76 needs only to be located at the edge of the die.

In FIG. 2R, the structure is metallized, such as by sputtering, to form a top source electrode 14, contacting the P+ contact region 76 and the sides of the N++ source region 22 to electrically short the regions together. The source electrode 14 may be formed by sputtering AlCu or AlSiCu and may be about 4 microns thick. A bottom drain electrode 12 is formed by sputtering layers of Ti, Ni, and Ag having respective thicknesses of 1000, 2000, and 10,000 Angstroms. The structure is then passivated with a passivation layer, and the passivation layer is patterned/etched to expose the electrodes for contact with leads of a package. For example, a wire bond may bond the source electrode 14 to one lead of the package, and the drain electrode 12 may be directly bonded to a heat sink plate electrode of the package.

FIG. 3 illustrates equi-potential contours in a depletion region between the substrate 28 top surface and P-well 18 of the device in an off state and with a voltage slightly less than the breakdown voltage, illustrating a substantially uniform distribution of the voltage. This uniform distribution of the voltage maximizes the breakdown voltage. Note that, with a maximum allowable voltage in the off state, the entire area below the P-well 18 and above the substrate 28 is depleted.

The P-shield 56 increases the breakdown voltage by effectively increasing the vertical size of the P-column 30 without having to grow an additional epitaxial layer. When the gate is grounded or negative, the P-shield 56, in addition to the vertical field plate extension of the gate 16 next to the N-layer 20 sidewall, helps to deplete the N- layer 20 laterally to achieve the uniform distribution of the voltage shown in FIG. 3. This lateral depletion allows a higher doping of the N- layer 20 for decreasing on-resistance.

Referring back to FIG. 1, the N-- layer 26 is thinner than the prior art drift layer since it does not extend all the way to the channel region. Forming adjacent P-columns 30 and N-columns 24 results in a super junction, where the columns completely deplete and the charges in the P and N areas are balanced. In the on state (gate positively biased), the current flows from the source electrode 14, through the source regions 22, through the lateral channel, then vertically through the N- layer 20 (including through an electron accumulation layer along its sidewalls), then vertically through the underlying N-column 24, N-- layer 26, and substrate 28 to the drain electrode 12.

Since the N-column 24 has a much higher dopant concentration than the N-- layer 26, it is much more conductive than the N-- layer 26, which reduces the on-resistance. Further, the N- layer 20 is fairly heavily doped and has an enhanced electron population along its sidewall due to the proximity to the positively biased gate 16, making the vertical path between the lateral channel and the N-column 24 very conductive. The specific on-resistance (Ron*Area) is thus low, and the overall on-resistance of the cell array is less than 1 Ohm. In one embodiment the specific on-resistance achieved is 4.5 Ohms-$mm^2$, which is about half that of a conventional power MOSFET. This enables smaller dies and double the yield per wafer.

Since there is no vertical channel that is inverted by a trenched gate, the trench of FIG. 1 can be fairly shallow (e.g., 4-10 microns), so is easier to form. The MOSFET 10 of FIG. 1 can be formed using standard processing equipment and, since there is no deep trench formed, the processing is fairly simple, reducing the cost per wafer.

In addition to the MOSFET 10 having an increased breakdown voltage and lower on-resistance, it has a faster recovery time after the MOSFET PN diode was biased on. The delay in gate-controlled switching after the PN diode has been biased on, followed by a reversal of the source/drain voltage, is due to stored charge when the diode is reversed biased. That stored charge must be removed for the diode to turn off and the MOSFET to turn on. The removal of charge in the MOSFET 10 is accelerated by the fairly highly doped N-column 24 and N- layer 20 as well as the effect of the positive gate on the sidewalls of the N- layer 20 drawing electrons to the sidewalls.

There are many variations of the basic MOSFET 10 of FIG. 1 that retain the various benefits of lower on-resistance and higher breakdown voltage. FIGS. 4-15E illustrate some of these variations.

Figure 4:
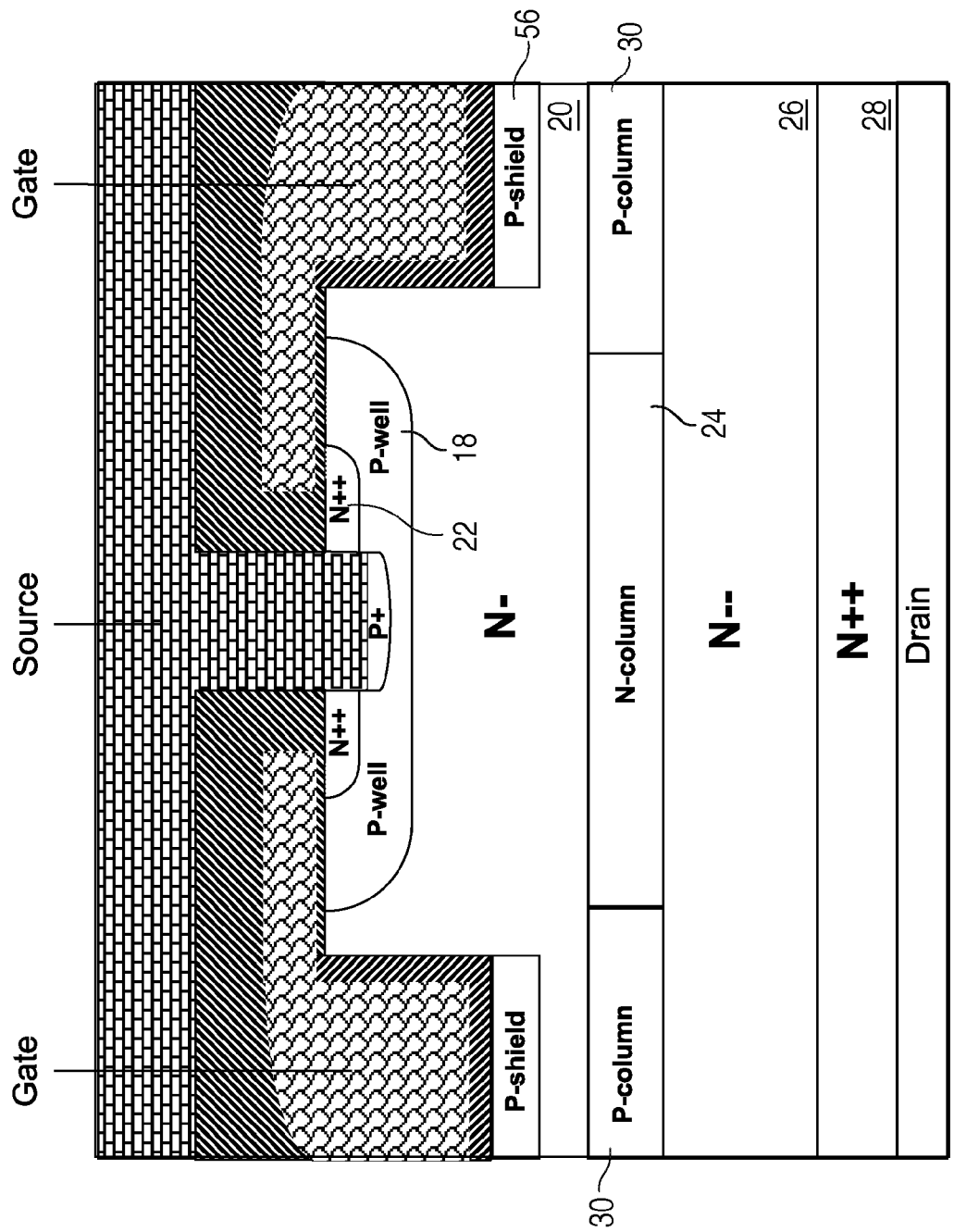
FIG. 4 illustrates a MOSFET with a shallower column layer or a shallower trench so the P-shield does not contact the underlying P-column.

FIG. 4 illustrates a MOSFET with a shallower column layer so the P-shield 56 does not contact the underlying P-column 30. The P-shield 56 still has the effect of laterally depleting the N-layer 20 so the N- layer 20 can be relatively highly doped to reduce on-resistance.

Figure 5:
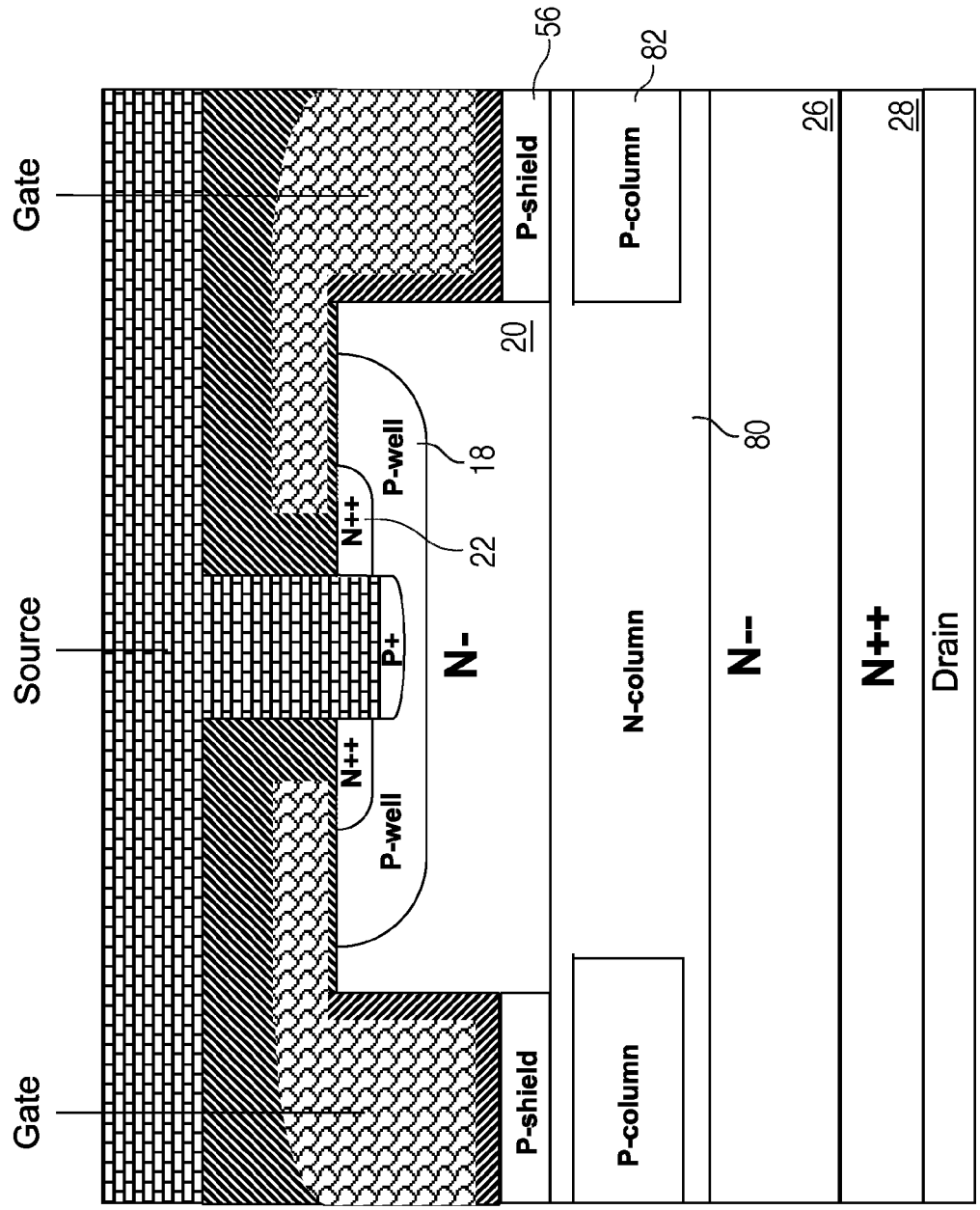
FIG. 5 illustrates a MOSFET with N-columns thicker than P-columns.

FIG. 5 illustrates a MOSFET with N-columns 80 deeper than P-columns 82. This serves to spread the current to avoid hot spots and further reduce on-resistance since the N-column 80 is more highly doped than the N-- layer 26.

Figure 6:
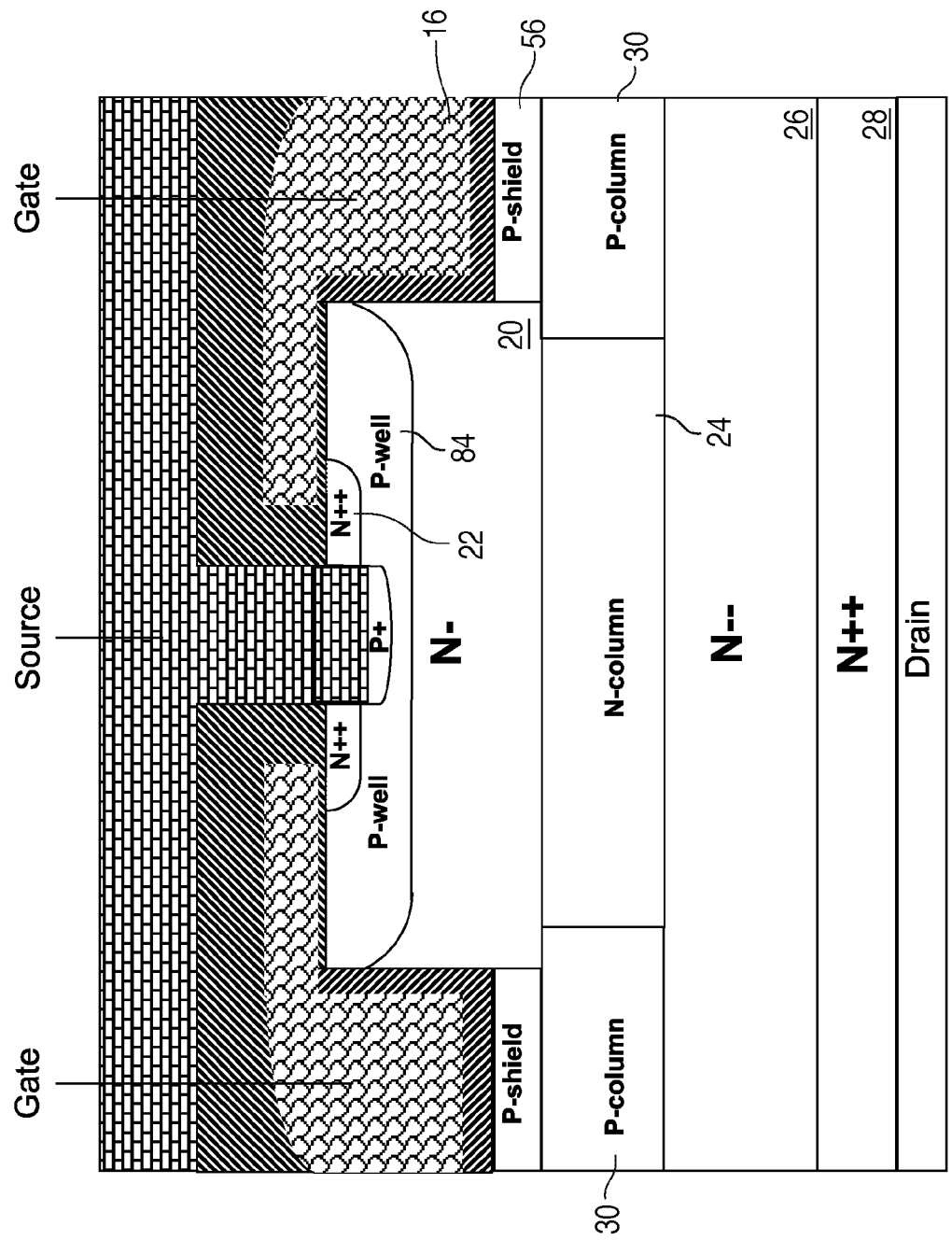
FIG. 6 illustrates a MOSFET where the P-well extends to the trench sidewall.

FIG. 6 illustrates a MOSFET where the P-well 84 extends to the trench sidewall. The overlying gate 16 and sidewall portion of the gate 16 inverts the top and side surfaces of the P-well 84 when the gate 16 is positively biased to turn on the MOSFET. This structure reduces the likelihood of the top thin gate oxide breaking down with a high drain-gate voltage since the thin gate oxide only overlies the P-well 84 and the P-well 84 is at the source voltage.

Figure 7A:
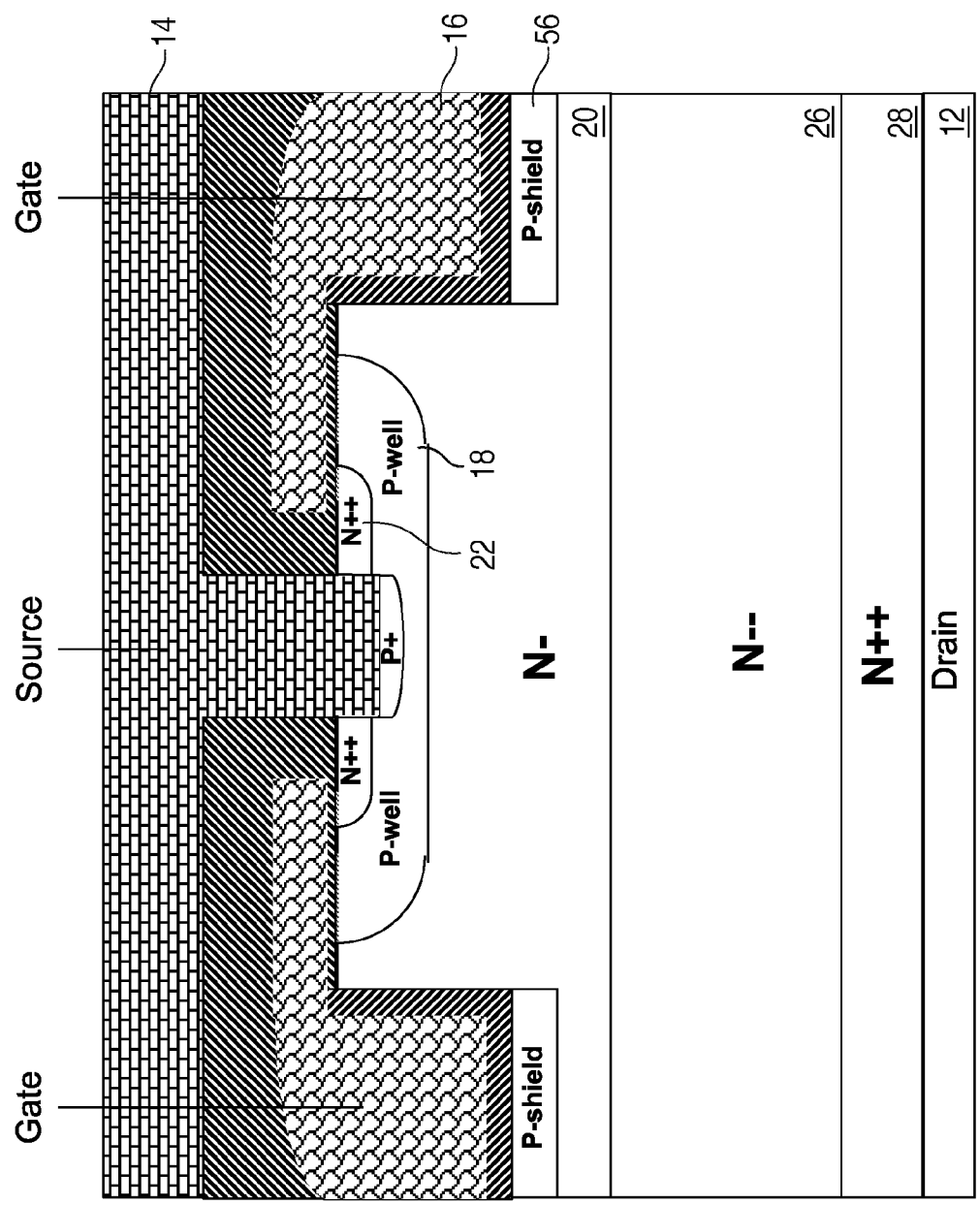
FIGS. 7A and 7B illustrate MOSFETs without N and P columns.
Figure 7B:
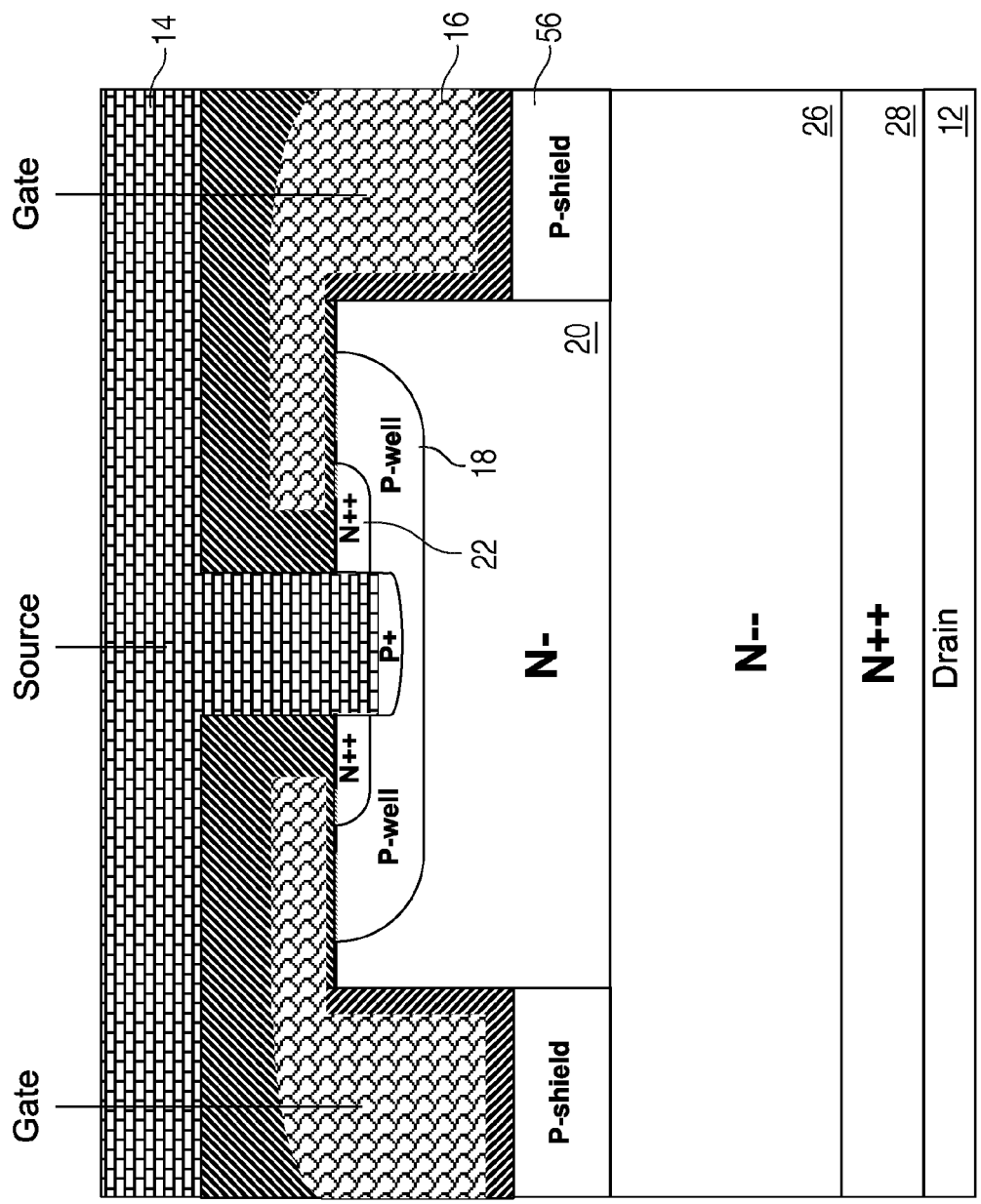

FIGS. 7A and 7B illustrate MOSFETs without N and P columns. In these embodiments, the benefit of the super junction of FIG. 1 is not utilized so the N-- layer 26 is thicker. Hence, on-resistance is not as good as with the MOSFET of FIG. 1. However, the gate structure combined with the N- layer 20 structure still results in an on-resistance that is reduced from the prior art.

Figure 8A:
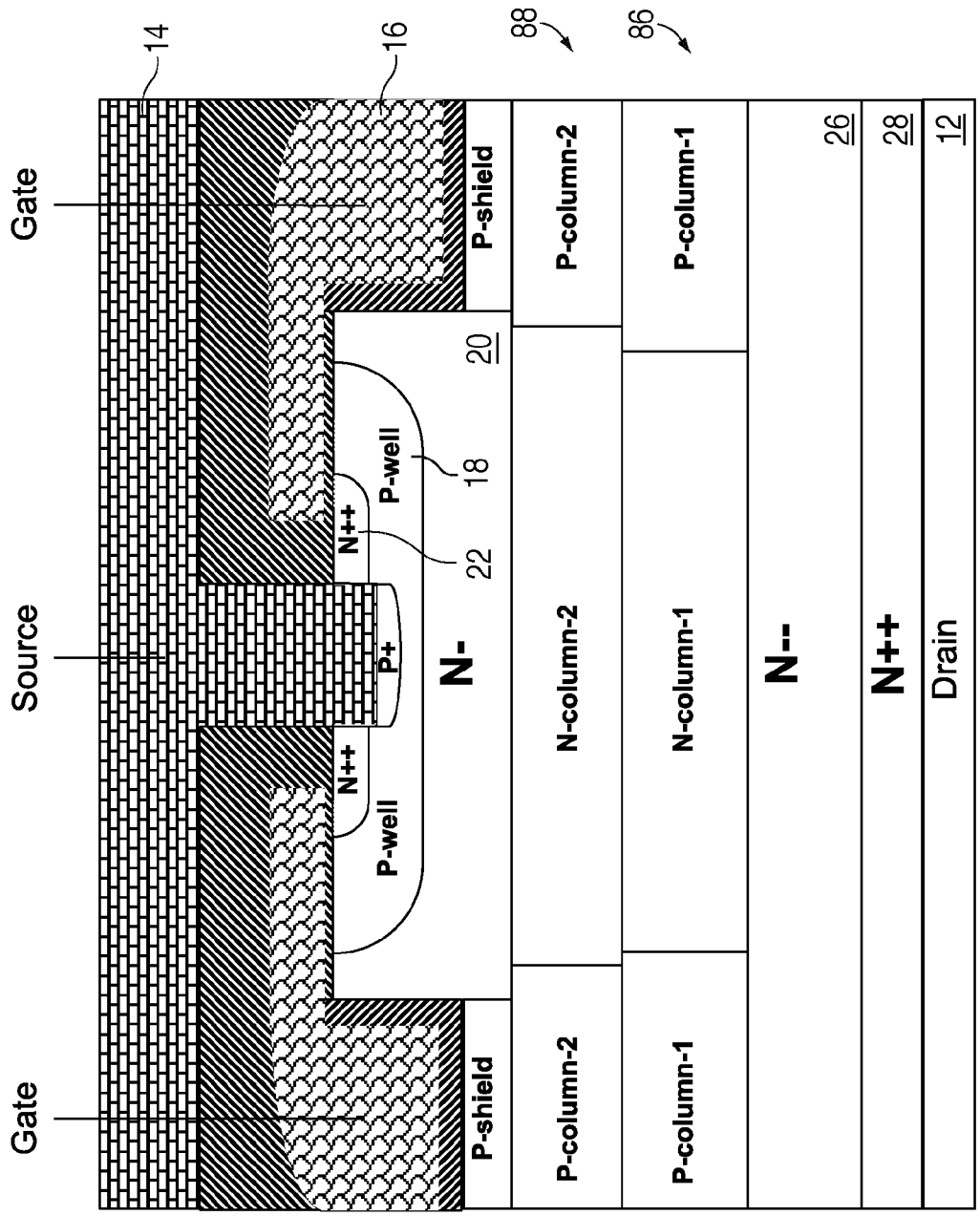
FIGS. 8A and 8B illustrate MOSFETs with multiple column layers.
Figure 8B:
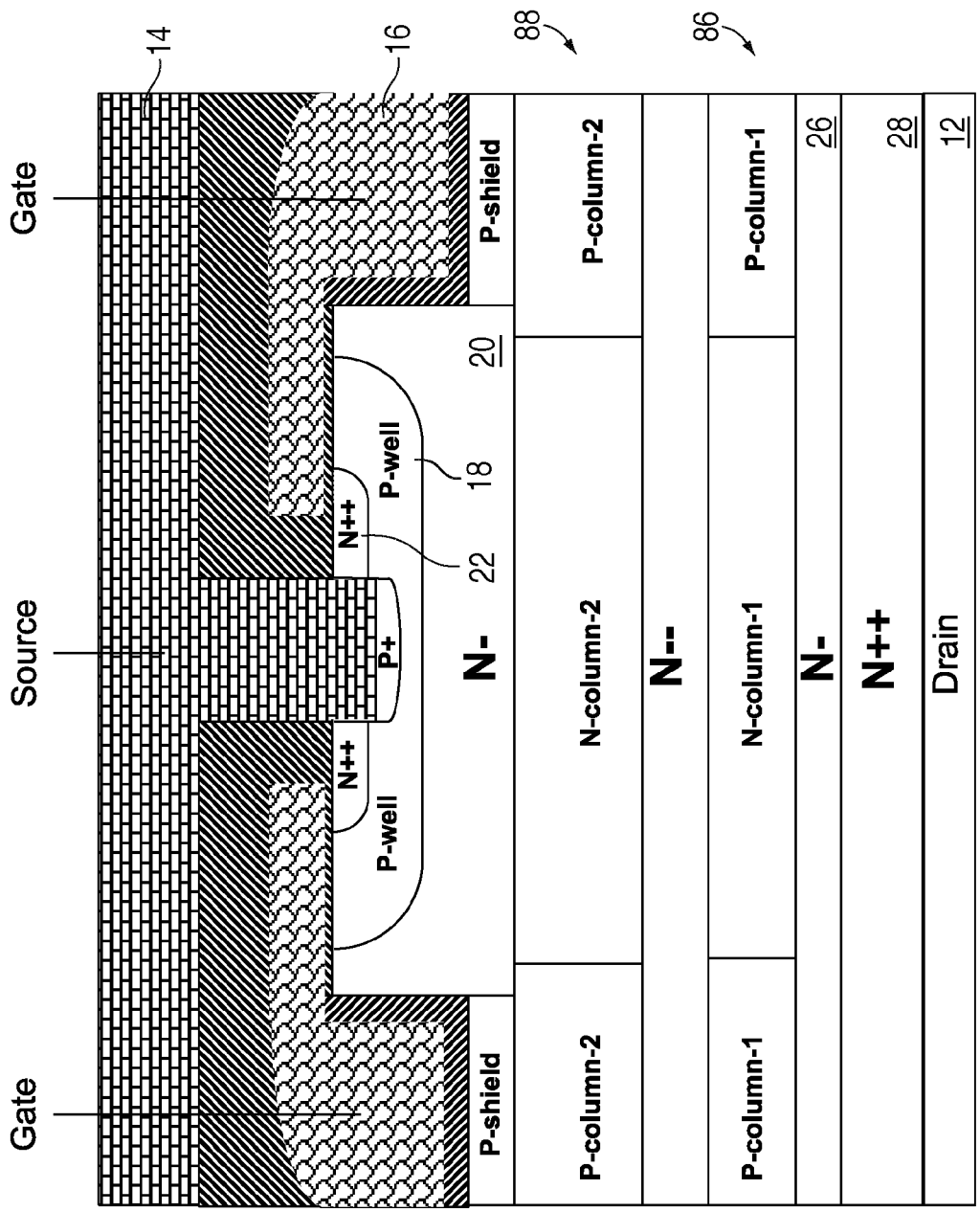

FIGS. 8A and 8B illustrate MOSFETs with multiple column layers 86 and 88. This allows the use of thinner column layers to achieve more uniform dopant concentrations in the columns. With a thick column layer, the implanted dopants need to be driven in a longer time, which also diffused the dopants laterally. By using multiple thinner column layers, less drive in time is required so the dopants do not laterally diffuse as much. This allows for a smaller cell pitch and a smaller die size. The multiple column layers deplete when the MOSFET is off, assuming a sufficiently high source-drain voltage, and the P and N-columns allow the dopant concentration in the columns to be fairly high due to the depletion characteristics of the super junction.

Figure 9:
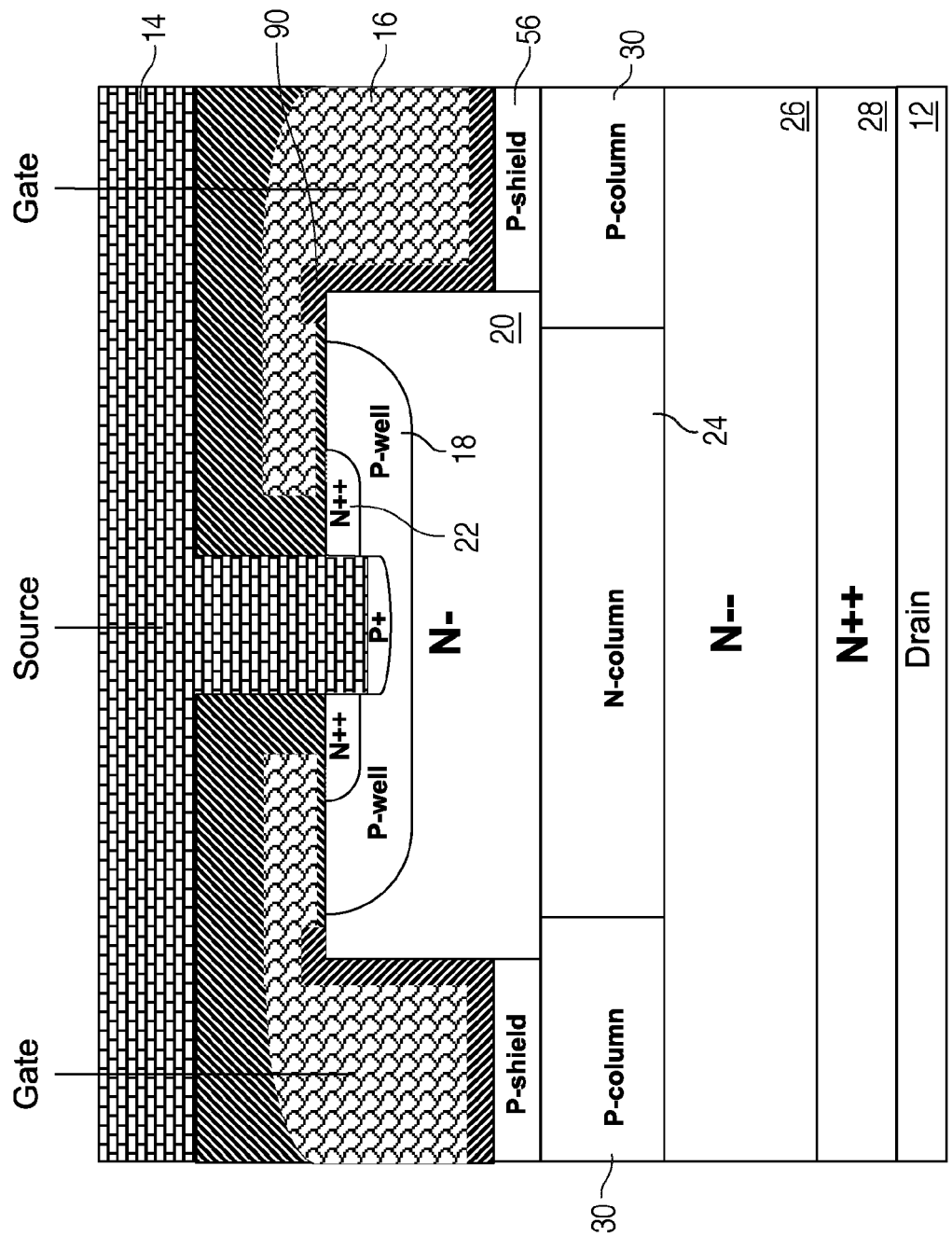
FIG. 9 illustrates a MOSFET with a thicker oxide above an edge of the N-layer to reduce the likelihood of oxide breakdown.

FIG. 9 illustrates a MOSFET with a thicker trench oxide 90 at the upper edges of the N– layer 20. Since there is usually electric field crowding at low radius corners, the thicker oxide helps prevent breakdown of the oxide layer between the N– layer 20 and the gate 16. The different oxide thicknesses are achieved by a masked etch.

Figure 10A:
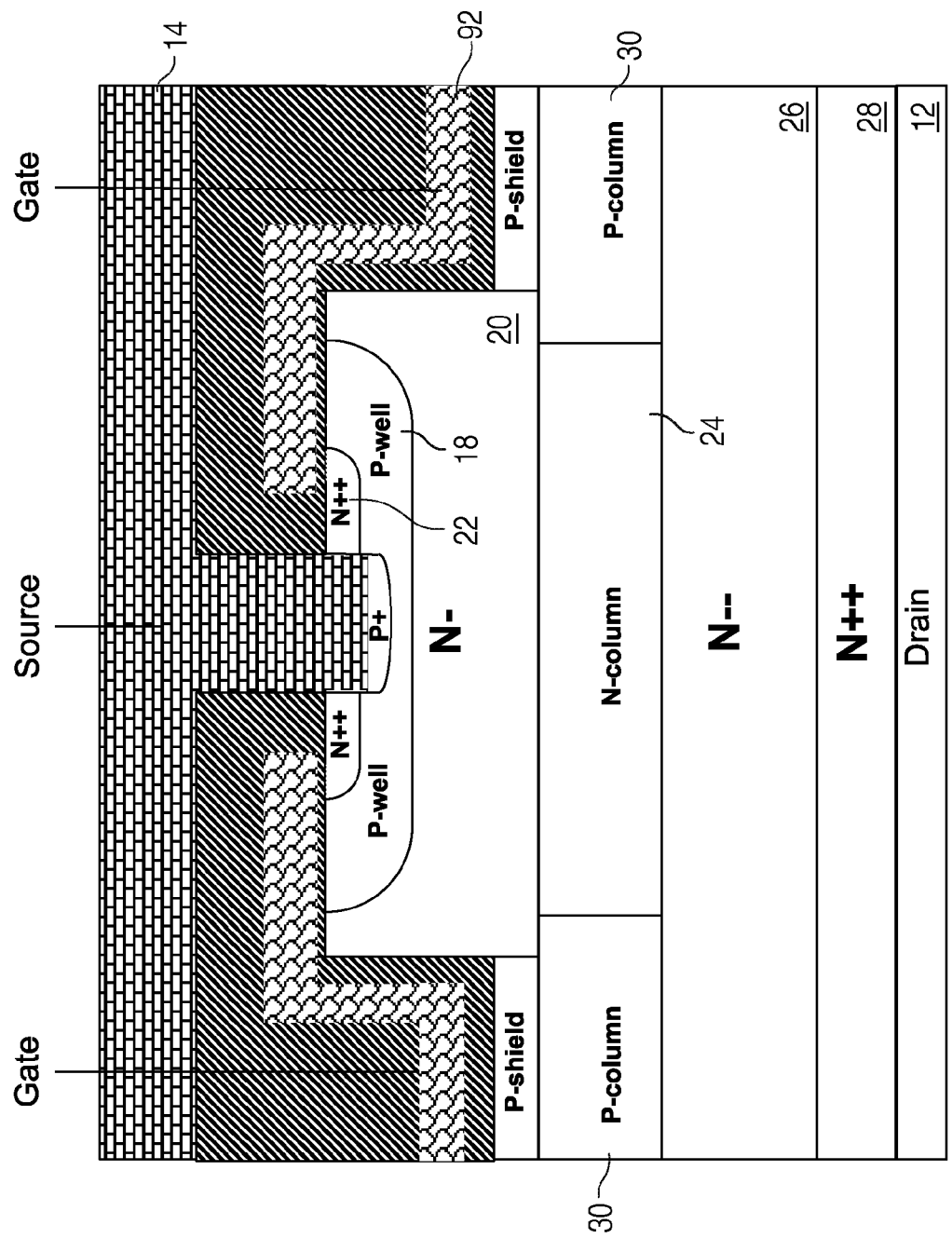
FIG. 10A illustrates a MOSFET with a more uniform thickness gate polysilicon layer.

FIG. 10A illustrates a MOSFET with a more uniform thickness gate polysilicon layer 92, compared with the gate polysilicon layer in FIG. 1. This may reduce processing time due to the thinner polysilicon layer.

Figure 10B:
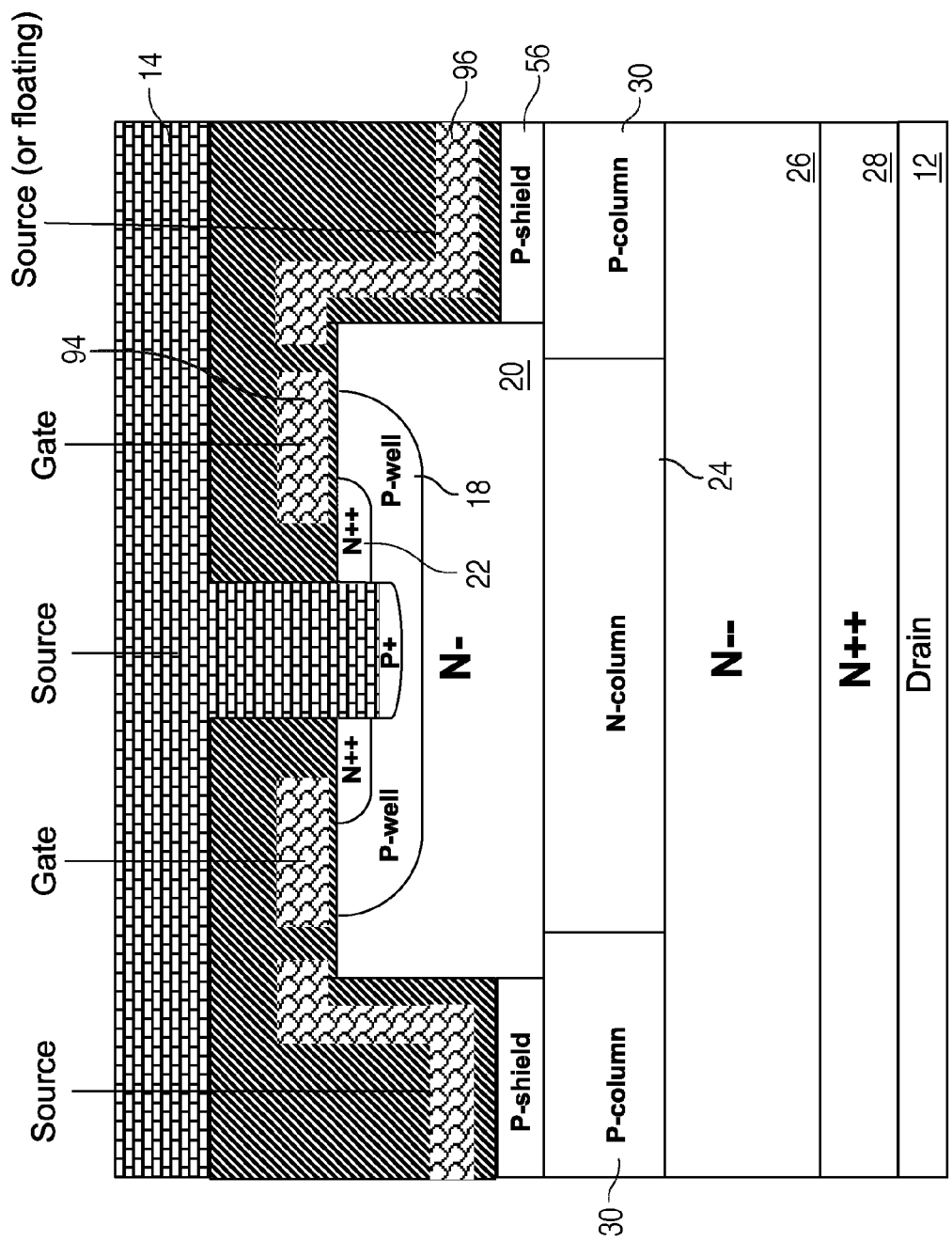
FIG. 10B illustrates a MOSFET with a split polysilicon layer, where the gap overlies the N− layer.

FIG. 10B illustrates a MOSFET with a split polysilicon layer 94 and 96, where the gap overlies the N– layer 20. The gate portion above the P-well 18 channel inverts the channel. The polysilicon layer 96 may be connected to the source or be floating and acts as a field plate for spreading the electric field distribution to achieve a more uniform electric field profile. The polysilicon layer 96 is inherently at a lower voltage than the gate when the MOSFET is on. This results in less voltage differential between the polysilicon layer 96 and the N– layer 20 and the P-shield 56. Since the gate portion only inverts the channel, there is less of a conductivity modulation in the N– layer 20. The gate to drain capacitance (the Miller capacitance) is reduced substantially, reducing the switching losses. Therefore, the conduction of the MOSFET vs. gate voltage is slightly more linear than that of the MOSFET of FIG. 1, with a slight increase in on-resistance, and switching power losses are reduced.

Figure 10C:
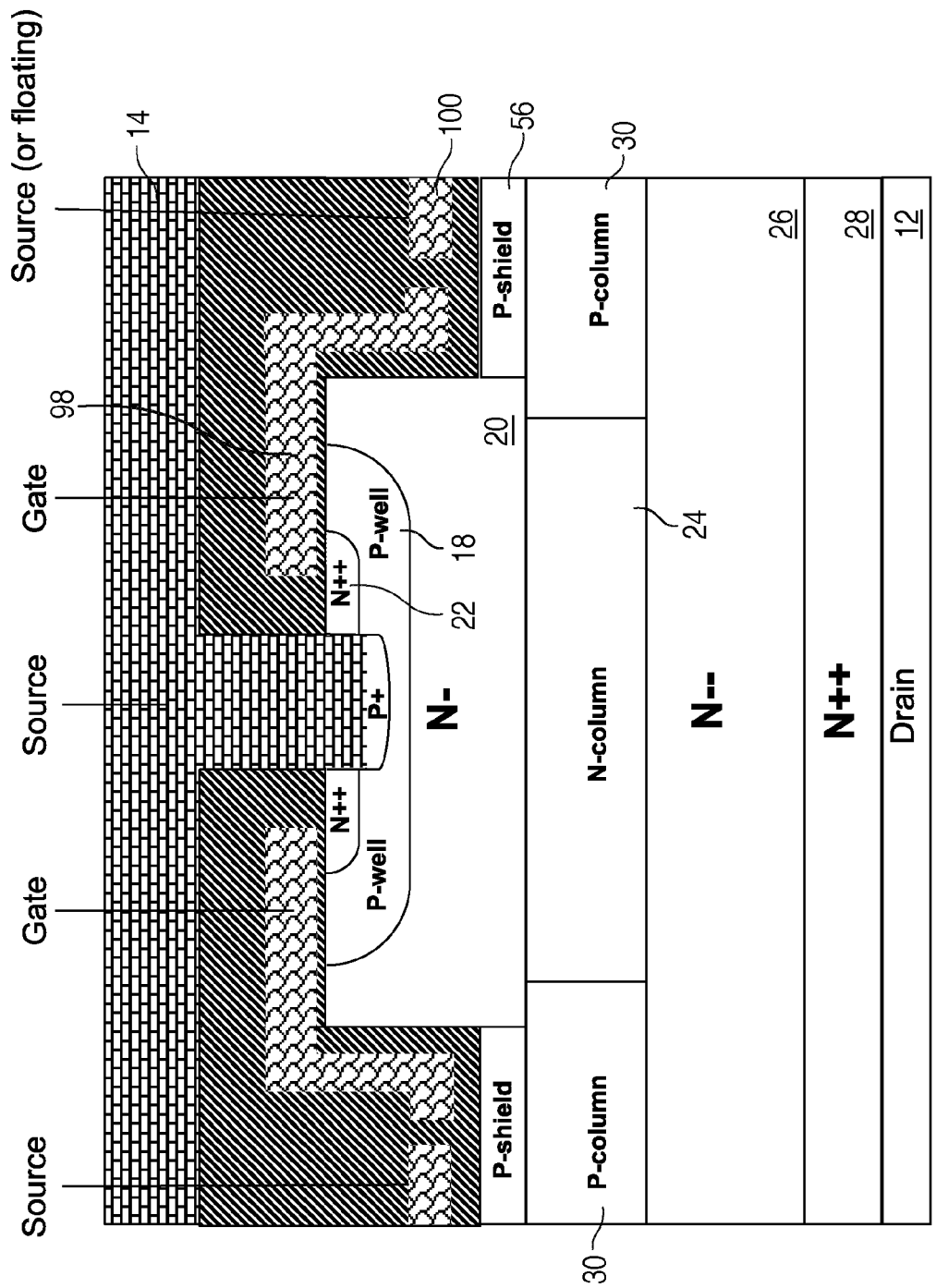
FIG. 10C illustrates a MOSFET with a split polysilicon layer where the gap overlies the P-shield.

FIG. 10C illustrates a MOSFET with a split polysilicon layer 98 and 100 where the gap overlies the P-shield 56. Thus the gate over the P-well 18 and sidewall of the N– layer 20 inverts the channel and accumulates electrons along the sidewall of the N– layer 20 for a lower on-resistance. The polysilicon layer 100 is connected to the source or floating.

Figure 10D:
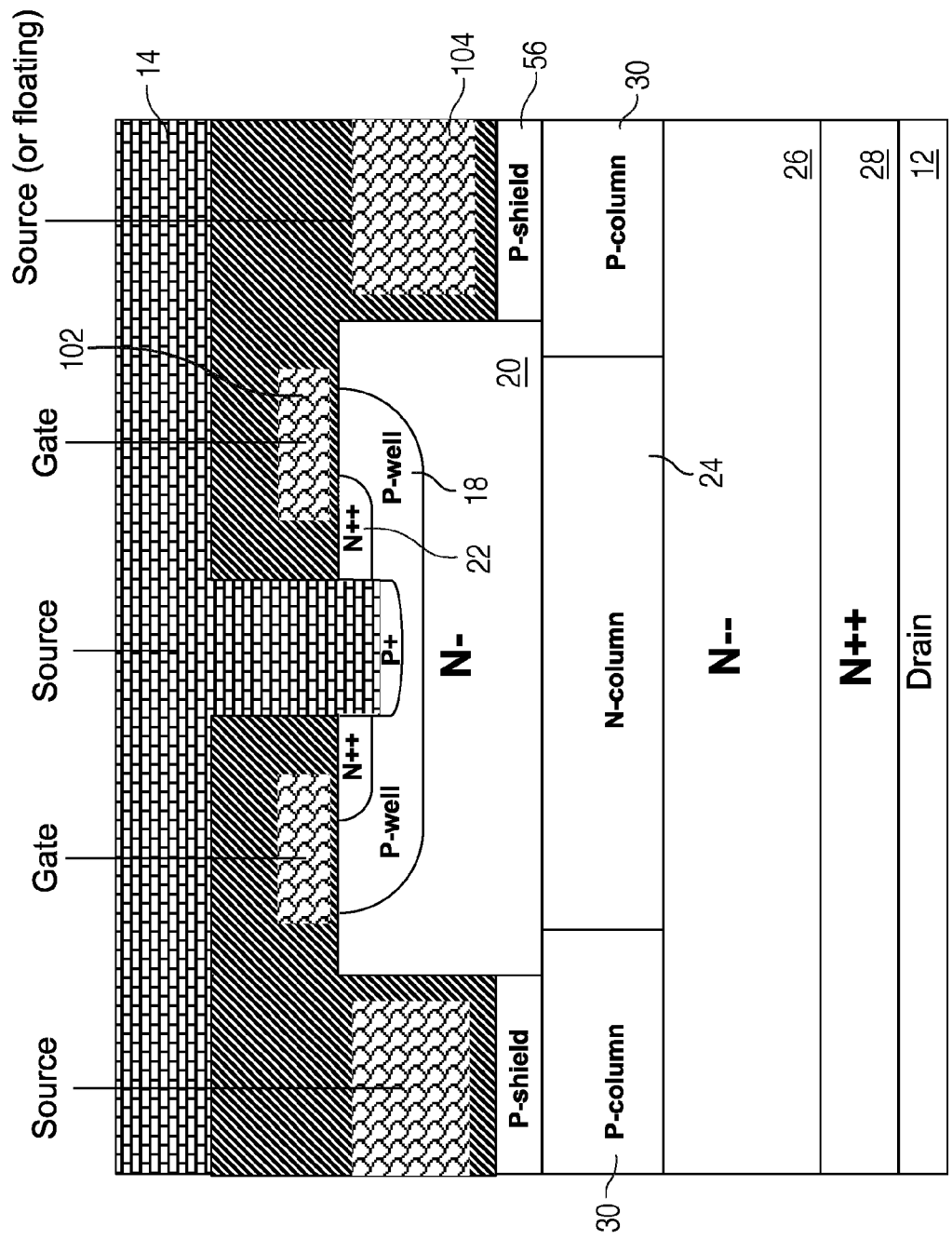
FIG. 10D illustrates a MOSFET with a split polysilicon layer where there is no polysilicon facing the edge of the N− layer.

FIG. 10D illustrates a MOSFET with a split polysilicon layer 102 and 104 where there is no polysilicon facing the edge of the N– layer 20. Therefore, there is less likelihood of oxide breakdown between the edge of the N-layer 20 and the polysilicon due to field crowding at the edge.

Figure 11A:
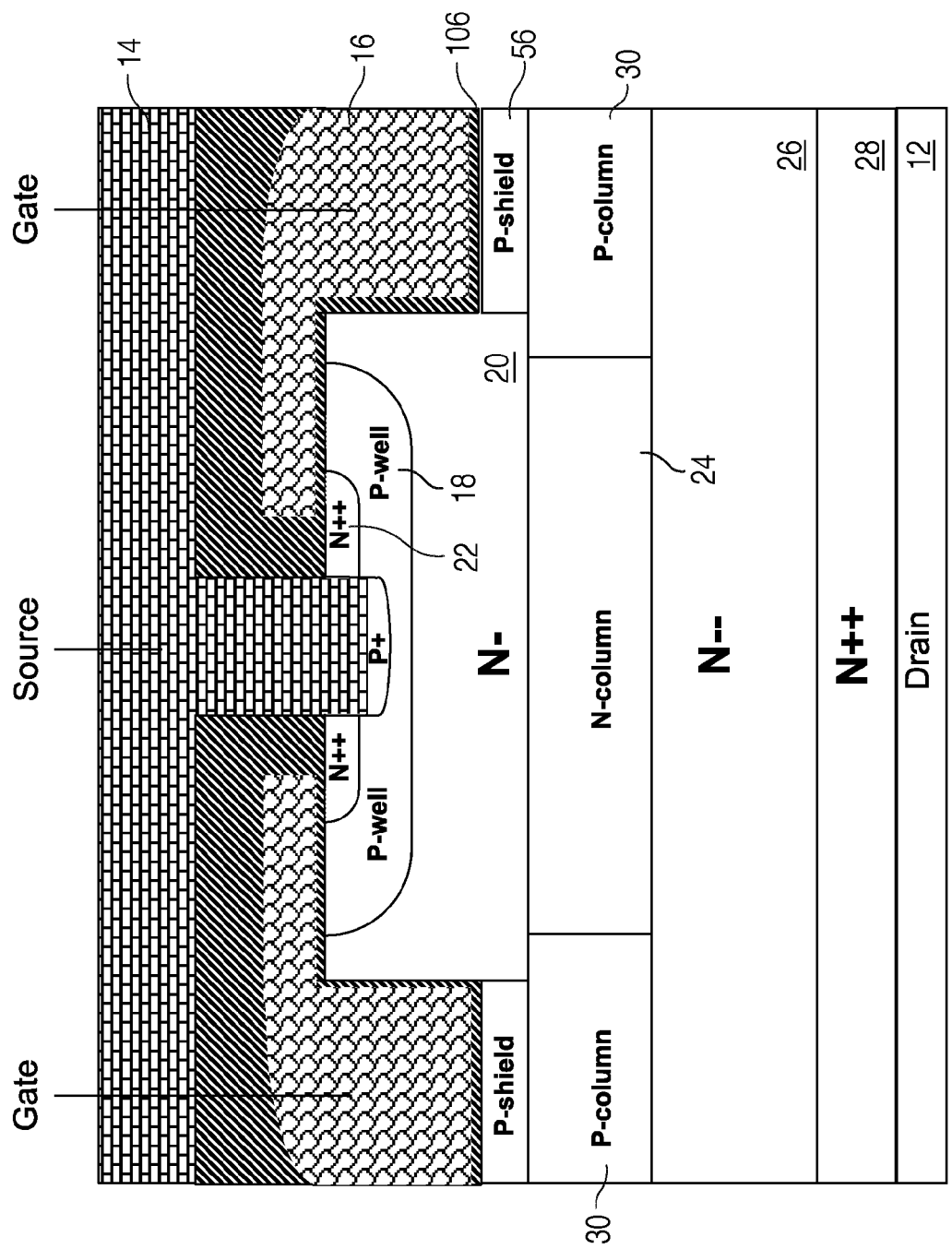
FIG. 11A illustrates a MOSFET where a uniform thin gate oxide overlies the lateral channel, the trench sidewall, and the P-shield.

FIG. 11A illustrates a MOSFET where a uniform thin gate oxide 106 overlies the lateral channel, the trench sidewall, and the P-shield 56. Thus, the effect of the gate 16 is most pronounced with this embodiment in reducing on-resistance; however, the likelihood of gate oxide breakdown is increased.

Figure 11B:
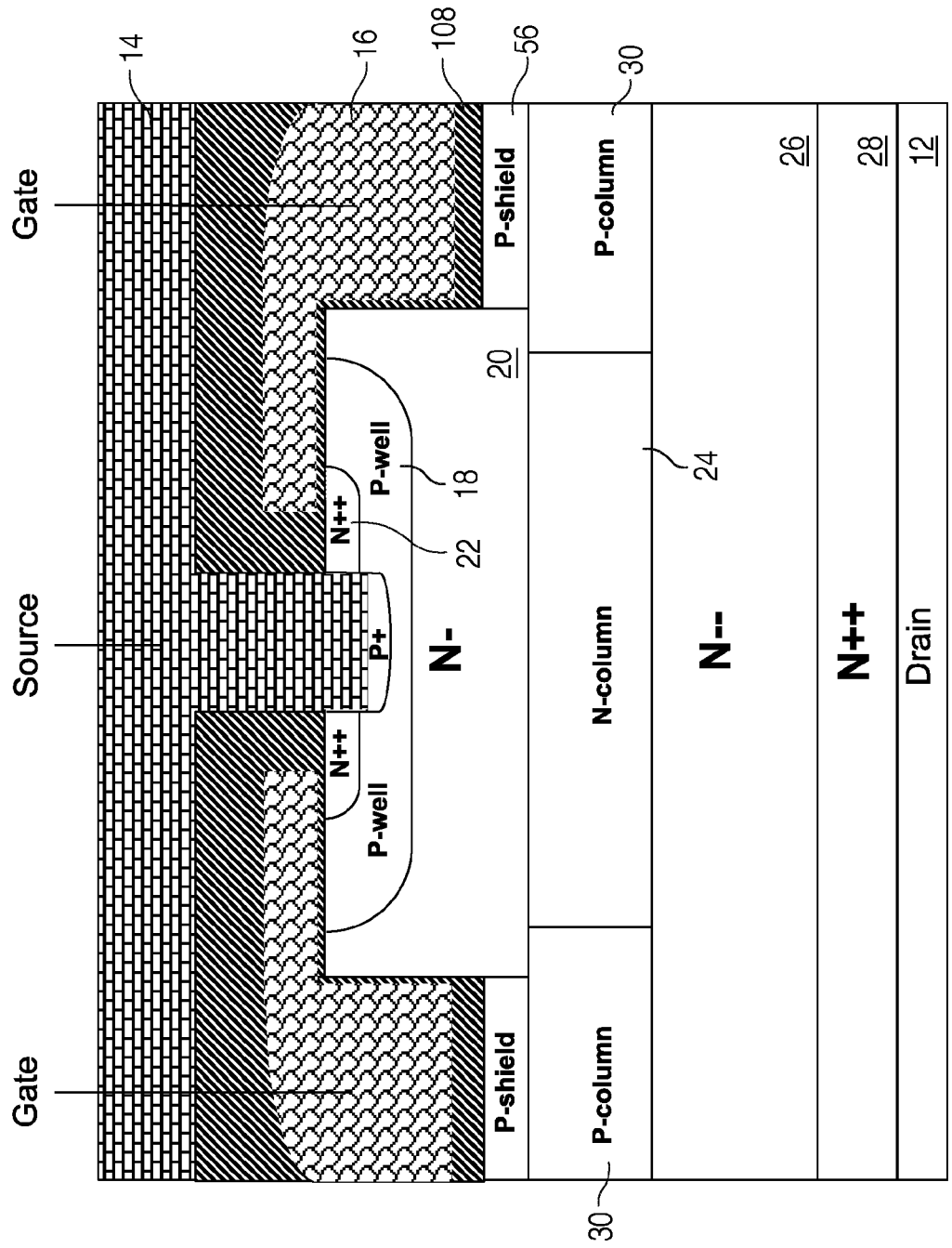
FIGS. 11B and 11C illustrate MOSFETs with a thicker oxide over the P-shield.
Figure 11C:
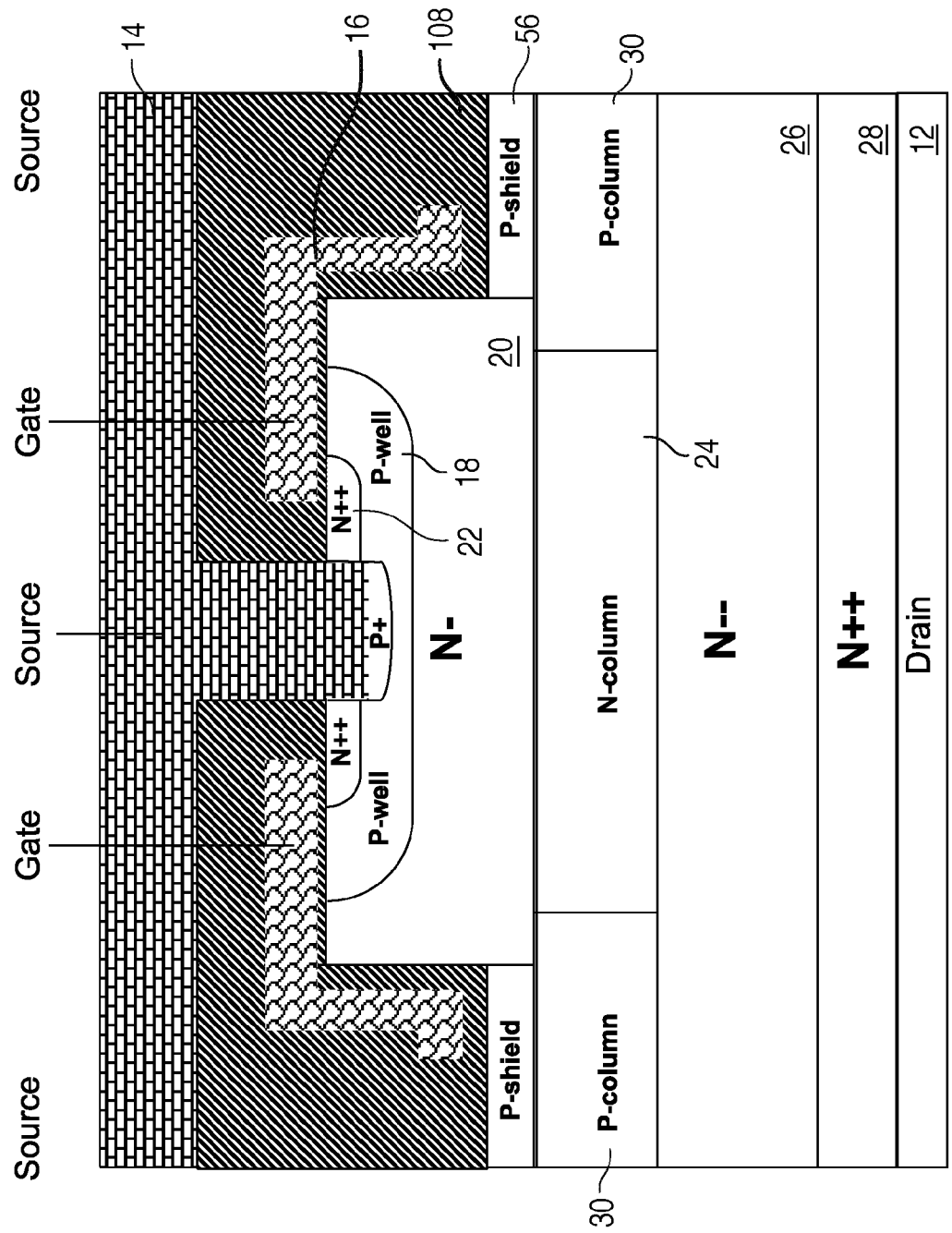

FIGS. 11B and 11C illustrate MOSFETs with a thicker oxide 108 over the P-shield 56 to reduce the likelihood of oxide breakdown over the P-shield 56.

Figure 11D:
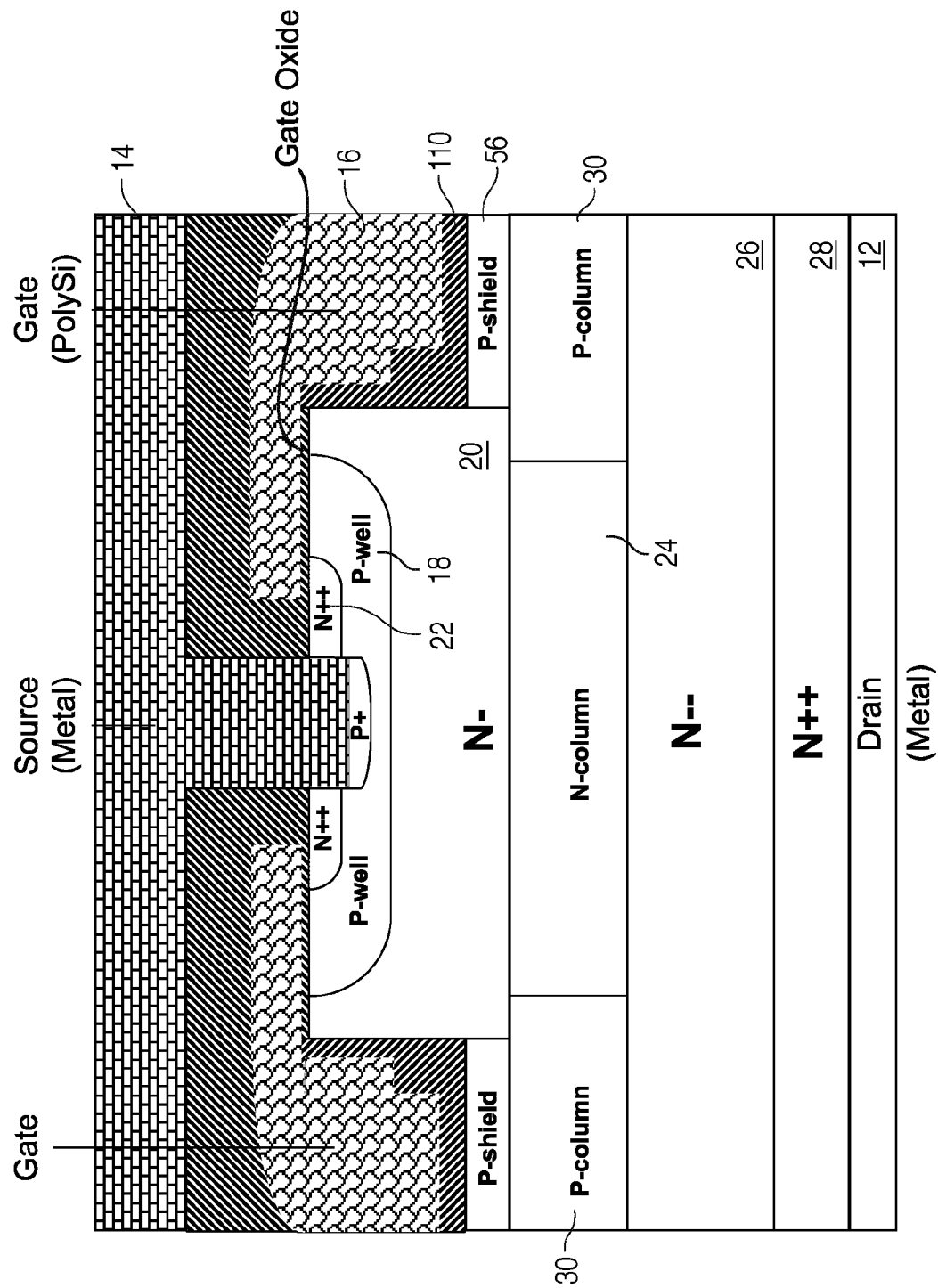
FIG. 11D illustrates a MOSFET with a variable thickness oxide next to the trench.

FIG. 11D illustrates a MOSFET with a variable thickness oxide 110 next to the trench to reduce the likelihood of oxide breakdown due to field crowding.

Figure 12A:
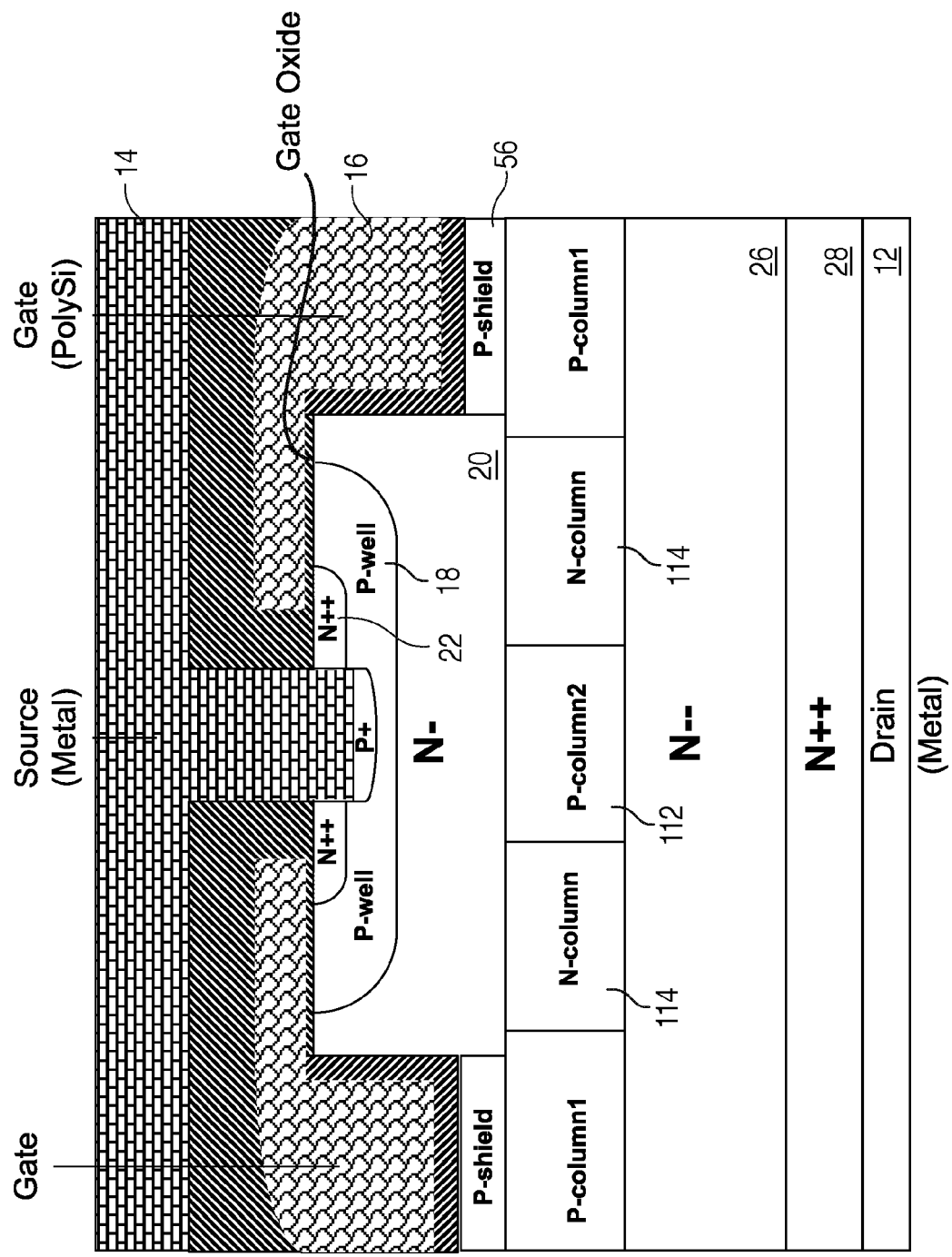
FIGS. 12A and 12B illustrate MOSFETs with a P-column below the P-well.
Figure 12B:
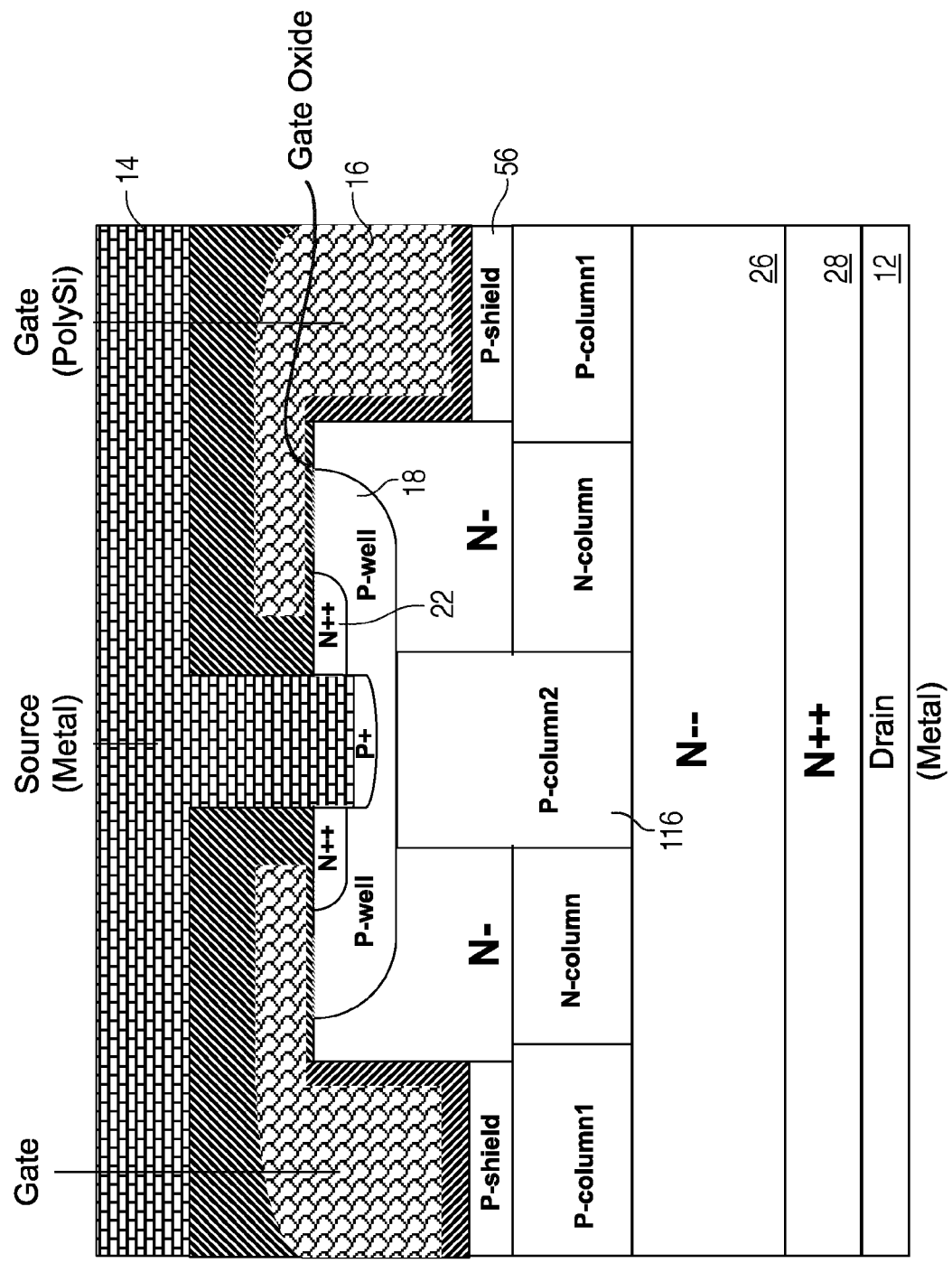

In the previous embodiments, a wide N-column was vertically positioned under the P-well 18. FIGS. 12A and 12B illustrate MOSFETs with a narrow P-column 112 below the P-well 18 and narrow N-columns 114 next to the center P-column 112. The narrower columns improve the lateral depletion of the columns when the MOSFET is off, so the columns can be more highly doped to reduce on-resistance. Since the current path is primarily along the edges of the N– layer 20, and there are N-columns 114 under those edges, the positioning the narrow P-column 122 under the middle of the P-well 18 does not adversely affect on-resistance.

In FIG. 12B, the center P-column 116 extends to the P-well 18. This helps laterally deplete the N– layer 20 in the off-state, allowing the N– layer 20 to be more highly doped to improve on-resistance.

Figure 13A:
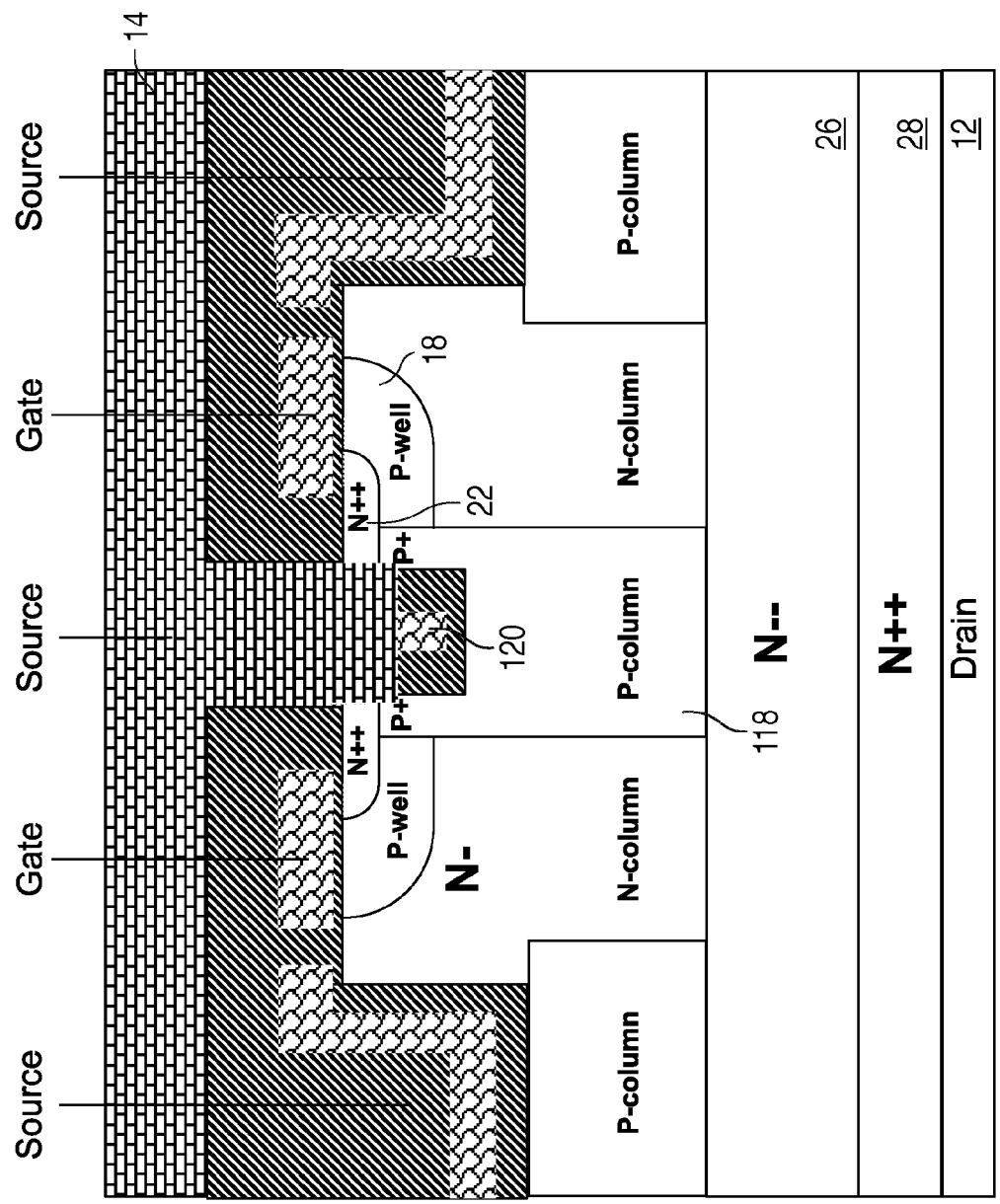
FIGS. 13A and 13B illustrate MOSFETs with a split polysilicon layer.
Figure 13B:
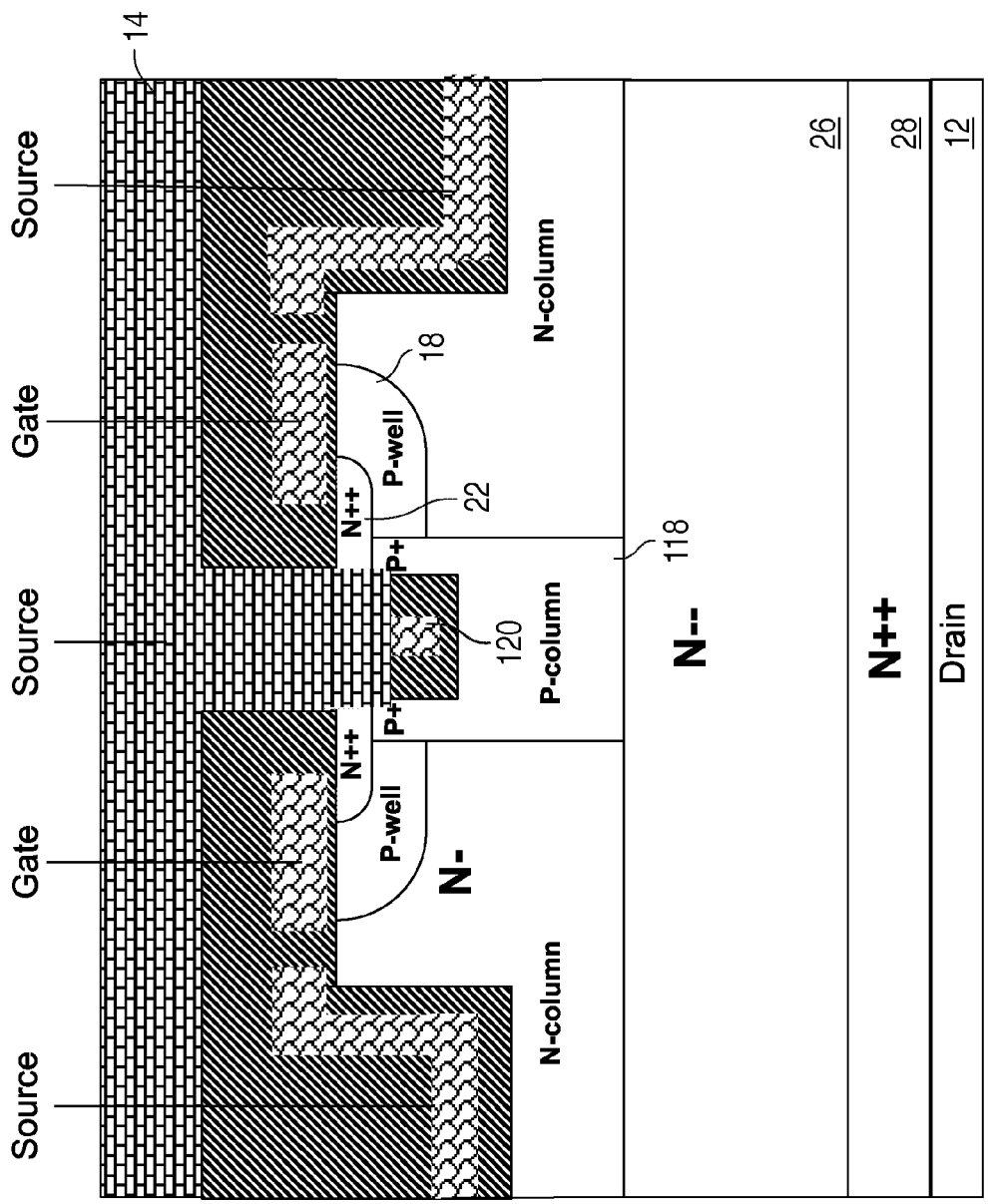

FIGS. 13A and 13B illustrate MOSFETs similar to the MOSFET of FIG. 10B (with the split polysilicon layer) but where the as in FIG. 10B, but where the middle P-column 118 extending to the P-well 18 and a conductive polysilicon portion 120, connected to the source electrode 14, protruding into the P-column 118 and insulated from the P-column 118. This helps deplete the P-column 118 in the off-state.

Figure 14A:
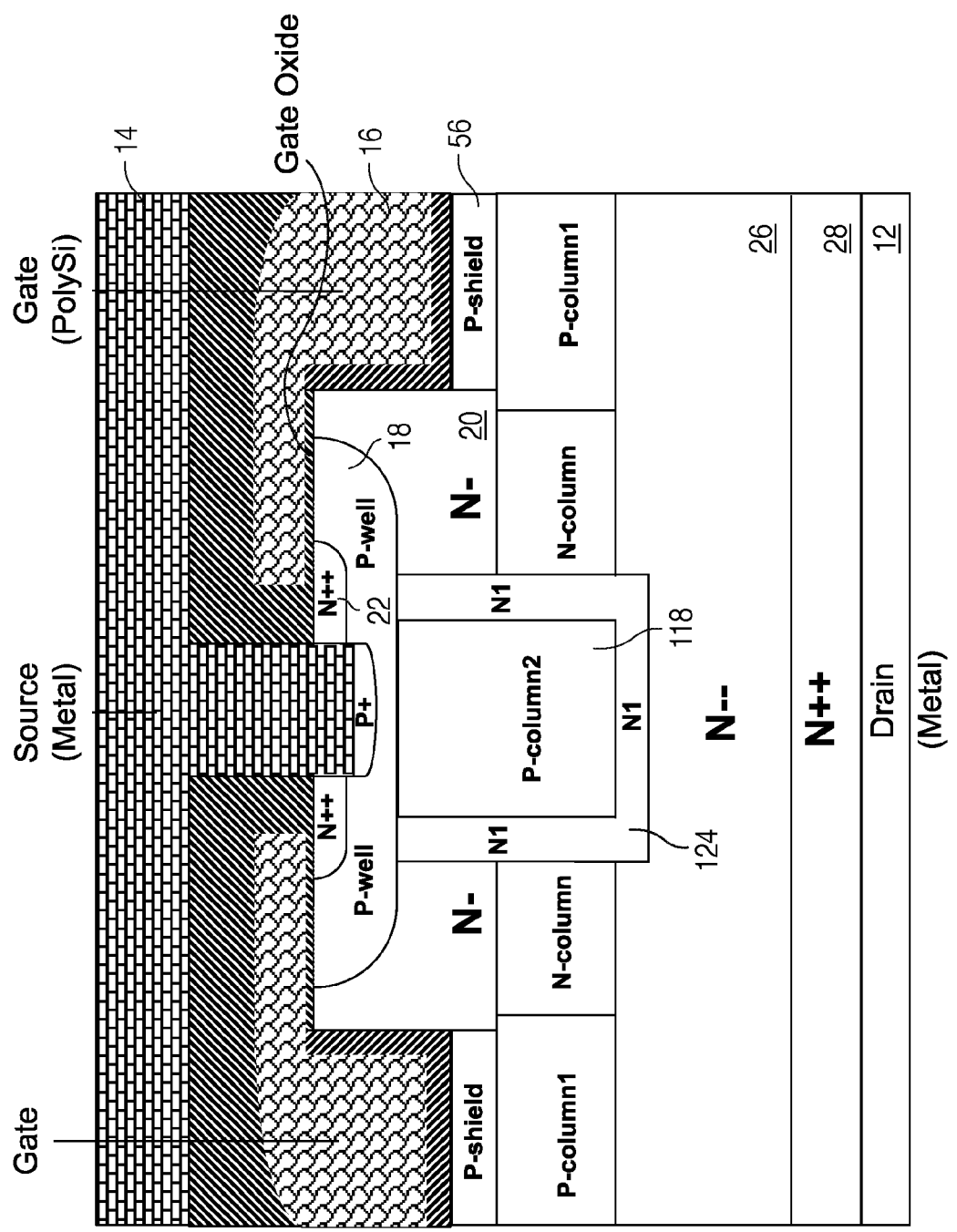
FIGS. 14A-14C illustrate MOSFETs with a conformal N-layer around the P-column.
Figure 14B:
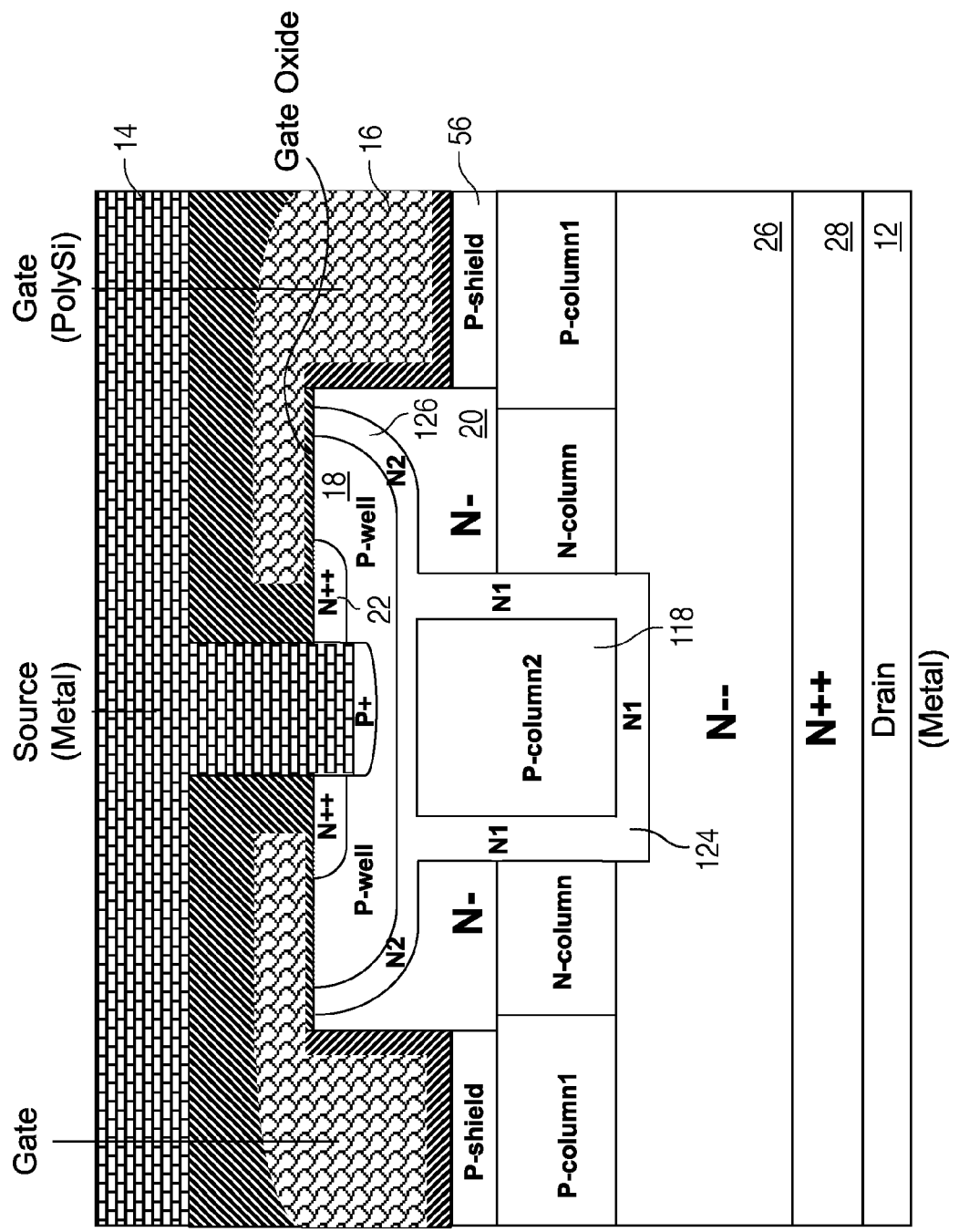
Figure 14C:
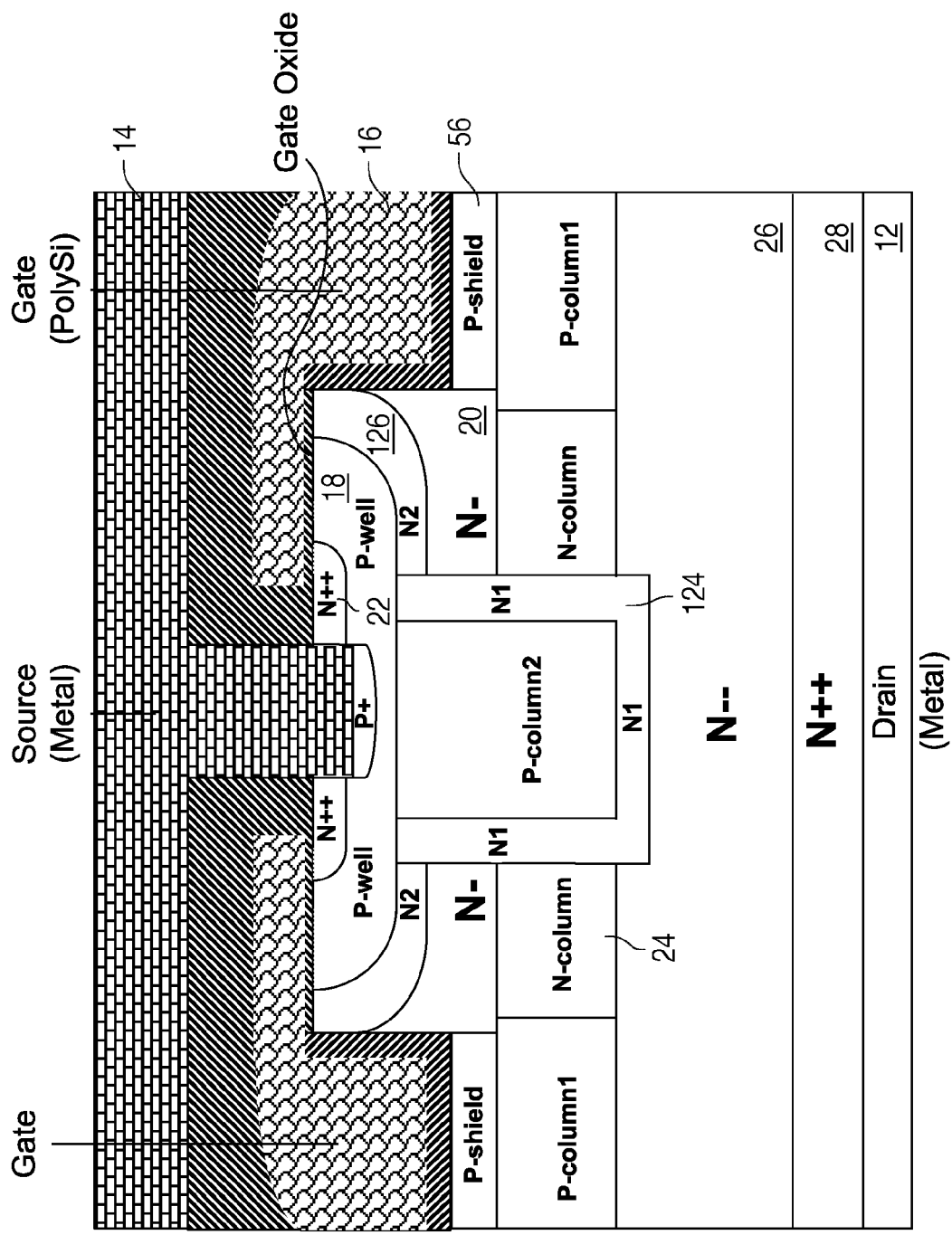

FIGS. 14A-14C illustrate MOSFETs with a conformal N-layer 124 around the P-column 118, and the P-column 118 extending to the P-well 18. The N-layer 24 has a dopant concentration about equal to the dopant concentration in the P-column 118. The N– layer 124 reduces carrier injection into the P-column 118 when the PN diode is forward biased to enable faster recovery when the source and drain voltage change polarity. This enables a faster switching time after the polarity has reversed. The N-layer 124 also reduces current spreading resistance to lower on-resistance.

FIGS. 14B and 14C add another N– layer 126 around the P-well 18 that is more highly doped than the N– layer 20 to reduce on-resistance. The N– layer 126 helps spread the current along the entire width of the P-well 18, and the N-layer 124 vertically conducts this current, along with the N-columns 24, to the N–– layer 26.

FIGS. 15A-15E illustrates various MOSFET embodiments converted to IGBTs (insulated gate bipolar transistor) by using a P+ type substrate 130. A thin N-type buffer layer 132 is added. The buffer layer 132 is used to control hole injection from the P+ substrate 130 and the breakdown characteristics of the IGBT. The drain electrode is now the collector electrode 134 of a PNP transistor, and the source electrode is now an emitter electrode of an NPN transistor. Thus, a vertical NPN transistor and PNP transistor are formed, which block current when the gate bias is low. When there is a sufficiently positive gate bias, an initial current flows between the source and drain, which injects sufficient carriers to forward bias the NPN and PNP transistors to create the IGBT action. This results in lower on-resistance than a vertical MOSFET. The maximum switching frequency is lowered however. The general operation of IGBTs is well-known.

Figure 15A:
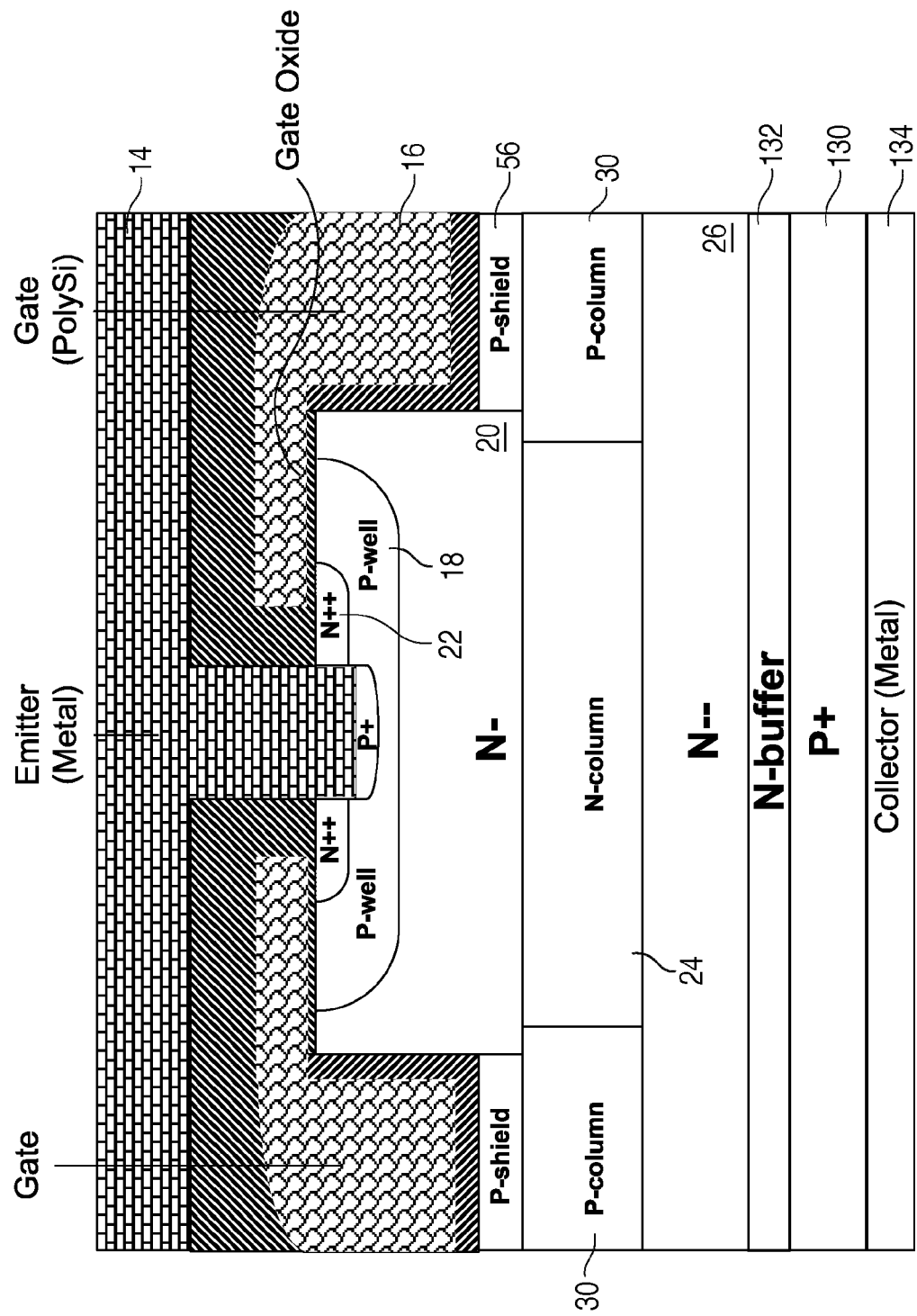
FIGS. 15A-15E illustrates various MOSFET embodiments converted to IGBTs by using a P+ type substrate.
Figure 15B:
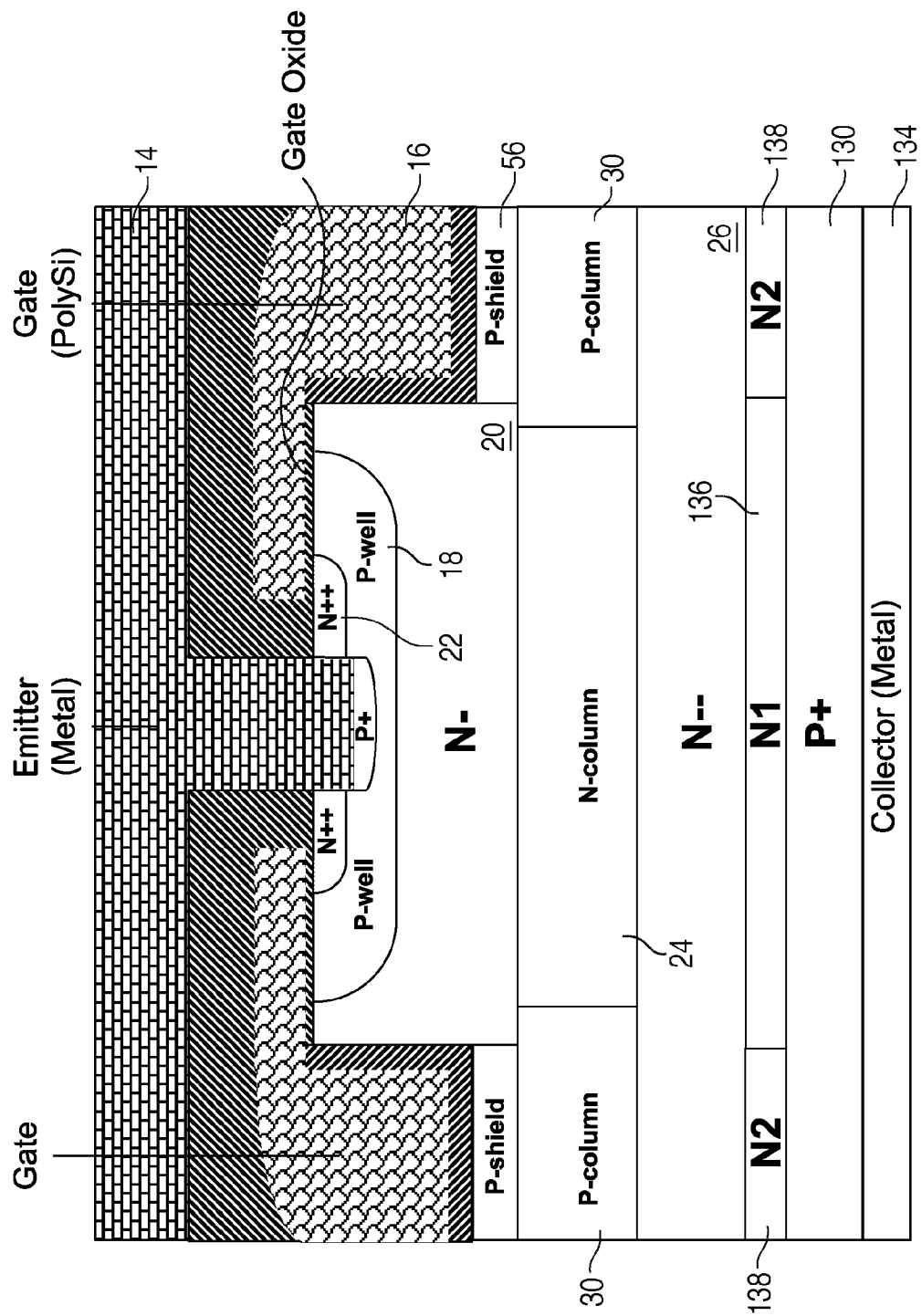

FIG. 15B illustrates an N-type buffer layer with differently doped N-type regions 136 and 138. The doping concentrations of regions 136 and 138 are about $1E17$ cm$^3$ and $2E17$ cm$^3$, respectively. A higher doping concentration reduces the breakdown voltage from the collector to the emitter, but increases the device turn-off switching speed. In addition, a different doping level of regions 136 and 138 can improve the trade-off between the breakdown voltage and the forward voltage of the device.

Figure 15C:
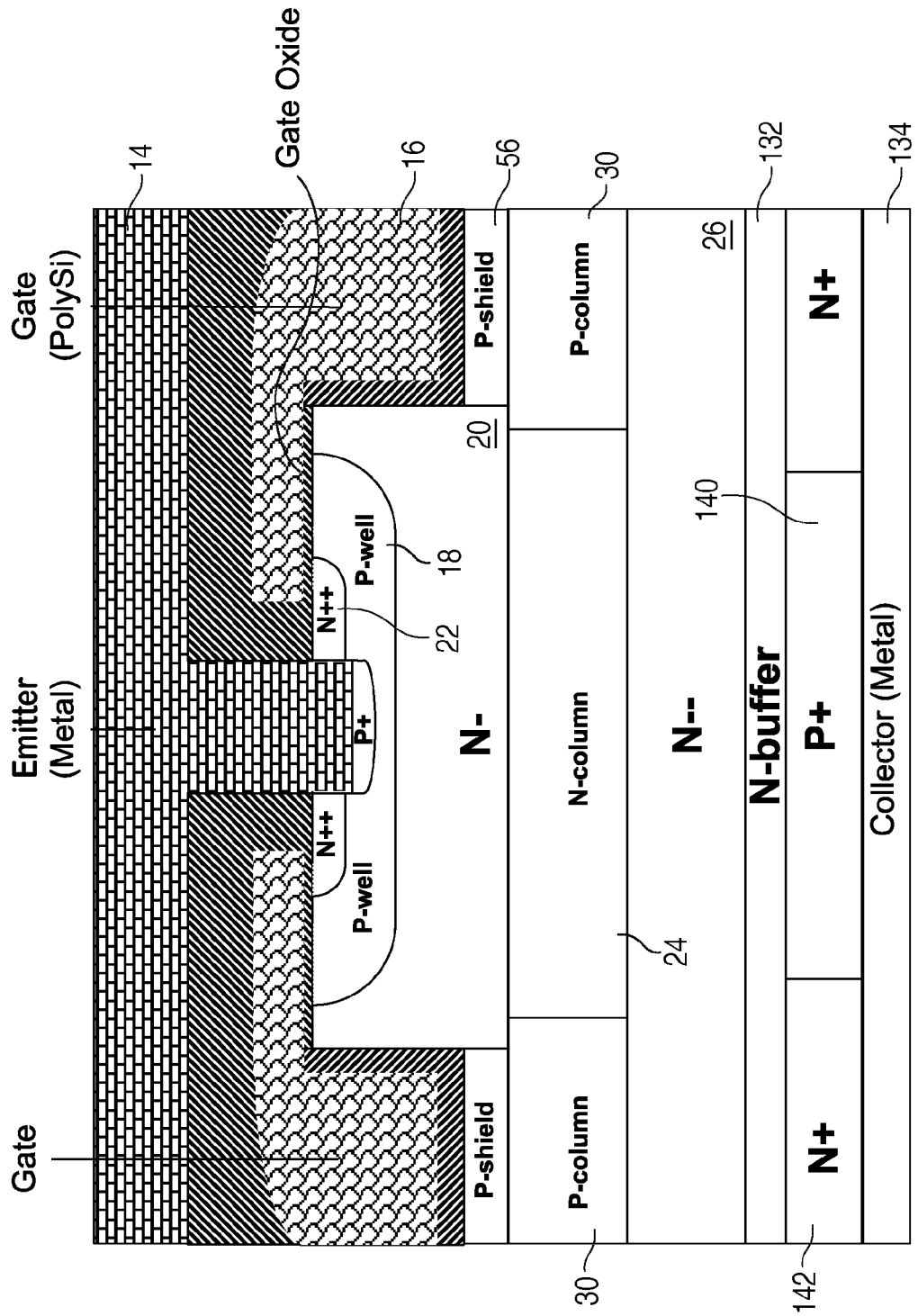

FIG. 15C illustrates that the collector electrode 134 is connected directly to the P+ region 140 of a substrate and N+ regions 142 of the substrate. The regions 142 allow the IGBT to be a PN diode when the collector electrode 134 is sufficiently negative with respect to the source (emitter) electrode. This integrates a free-wheeling diode into an IGBT, which is useful for certain applications where the voltages change polarity.

Figure 15D:
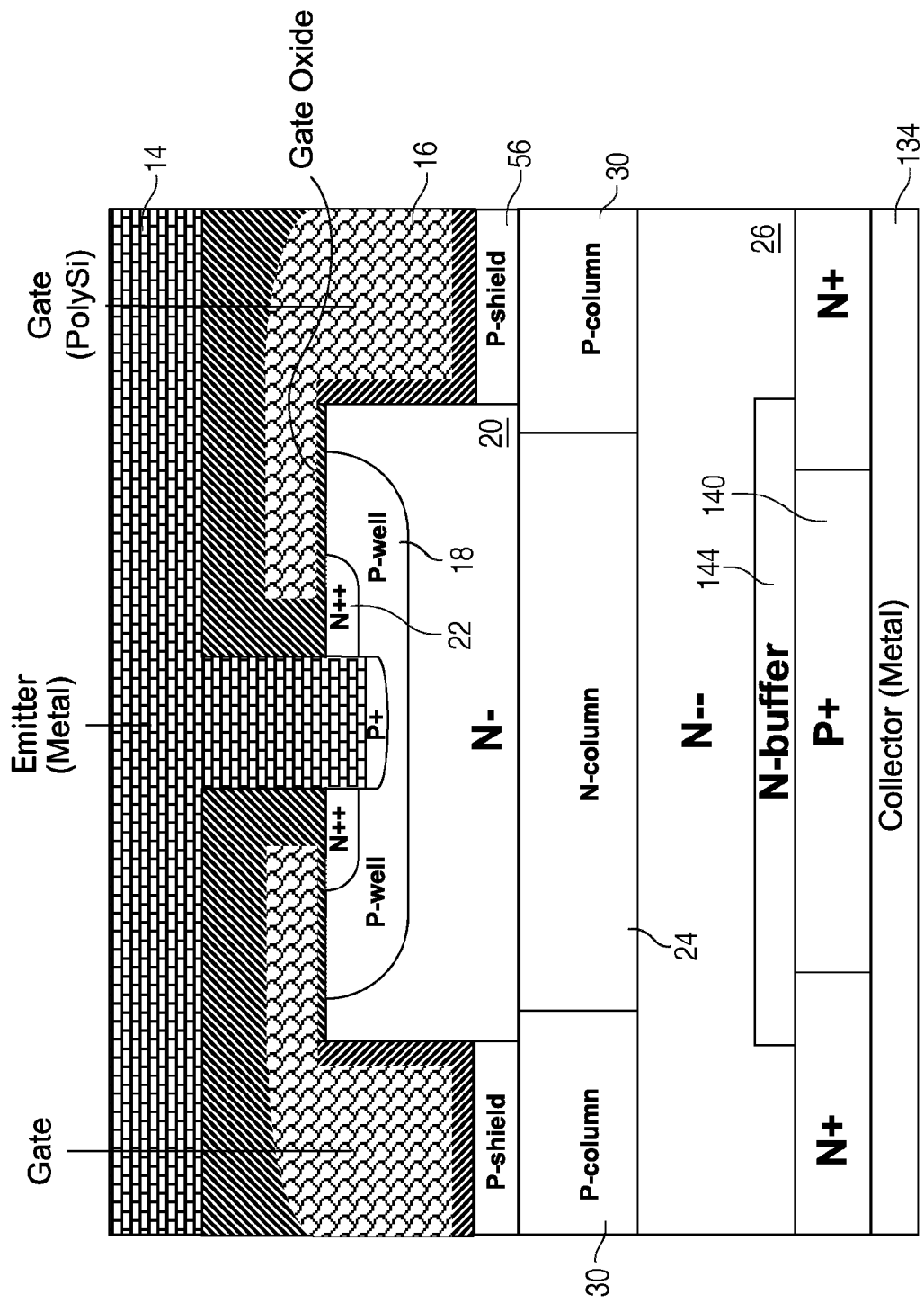

FIG. 15D adds an N-buffer layer 144 over the P+ region 140 to adjust the hole injection efficiency from the P+ region 140 (collector).

Figure 15E:
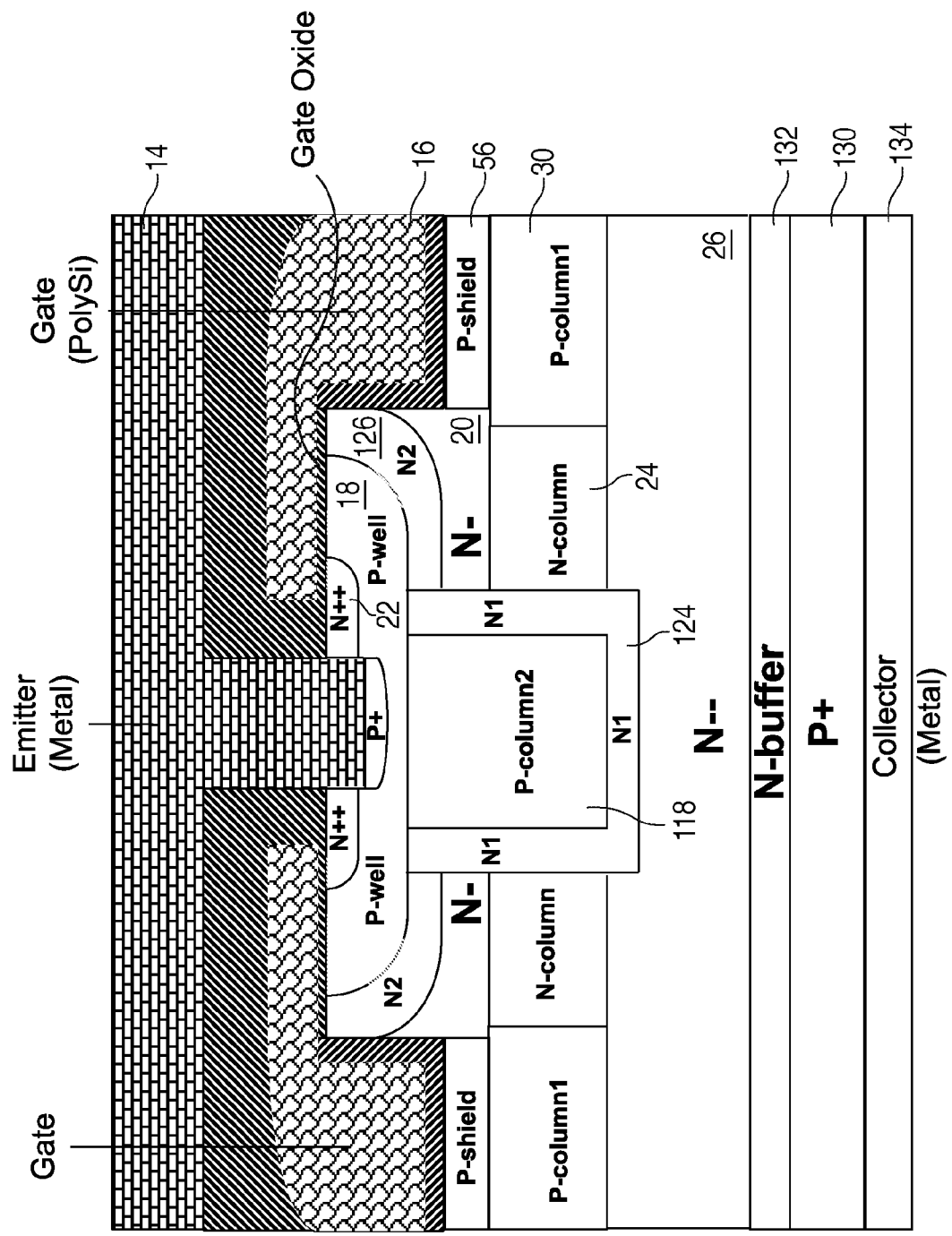

FIG. 15E combines many of the previously described features into a single IGBT.

Figure 16:
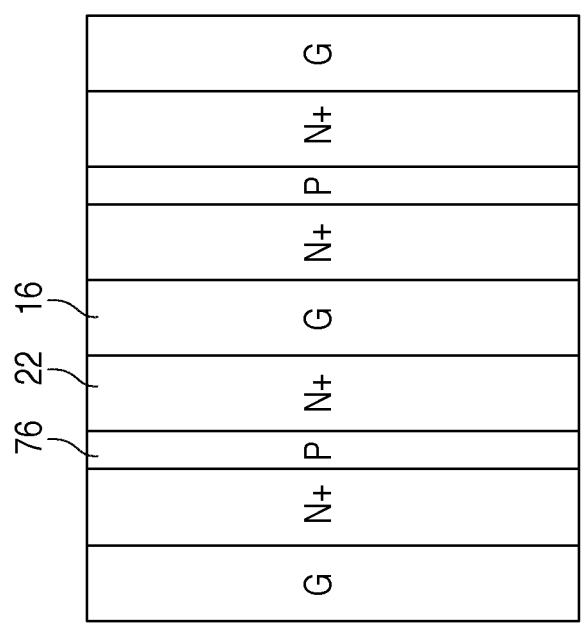
FIG. 16 is a top down view of one type of cellular array using any of the MOSFET cells or IGBT cells described herein, where the cells are arranged as stripes.

FIG. 16 is a top down view of one type of cellular array using any of the MOSFET cells or IGBT cells described herein, where the cells are arranged as stripes. Only the gate 16, source region 22, and P+ contact region 76 are shown. The P+ contact region 76 may be only at one end of each strip.

Figure 17:
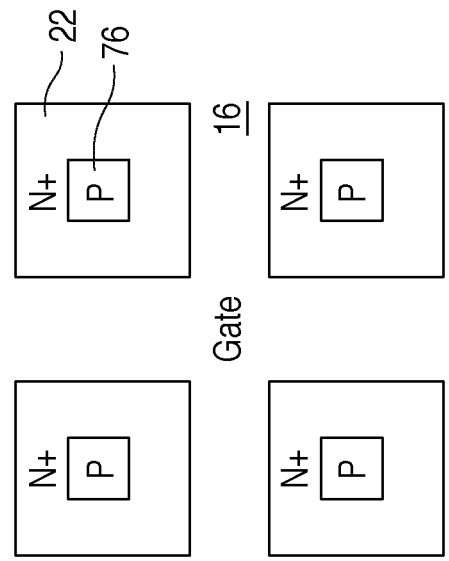
FIG. 17 is a top down view of another type of cellular array using any of the MOSFET cells or IGBT cells described herein, where the cells are arranged as squares.

FIG. 17 is a top down view of another type of cellular array using any of the MOSFET cells or IGBT cells described herein, where the cells are arranged as squares. Only the gate 16, source region 22, and P+ contact region 76 are shown. Hexagons or other shapes may also be used.

Any of the disclosed features can be combined in any combination in a MOSFET or IGBT to achieve the particular benefits of that feature for a particular application.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A vertical transistor comprising
a semiconductor substrate having a first electrode on its bottom surface;
a first layer of a first conductivity type above the substrate, the first layer having a first dopant concentration;
a second layer of the first conductivity type above the first layer, the second layer having a second dopant concentration higher than the first dopant concentration, the second layer having a top surface;
a trench exposing a vertical sidewall of the second layer;
a well region of a second conductivity type in the top surface of the second layer, the well region having a top surface;
a first region of the first conductivity type in the top surface of the well region, wherein an area between the first region and an edge of the well region comprises a channel for inversion by a gate;
a conductive gate overlying the channel for creating a lateral conductive path between the first region and the second layer when the gate is biased above a threshold voltage;
a vertical field plate facing the vertical sidewall of the second layer and insulated from the sidewall, the vertical field plate being an extension of the gate, the vertical field plate surrounding the second layer; and
a second electrode electrically contacting the well region and the first region, wherein when a voltage is applied between the first electrode and the second electrode and the gate is biased above the threshold voltage, a lateral current flows across the channel and a substantially vertical current flows between the channel and the substrate.

2. The transistor of claim 1 further comprising:
a third layer of the first conductivity type between the first layer and the second layer and located below the channel; and
a fourth layer of the second conductivity type laterally abutting the third layer on opposite sides of the third layer, a dopant concentration in the third layer and fourth layer being higher than the first dopant concentration.

3. The transistor of claim 2 further comprising a fifth layer of the second conductivity type below the trench and laterally adjacent to the second layer.

4. The transistor of claim 3 wherein the fifth layer abuts the fourth layer.

5. The transistor of claim 3 wherein the first layer is vertically separated from the fourth layer.

6. The transistor of claim 3 wherein the gate has a first portion overlying the channel, a second portion facing the vertical sidewall of the second layer acting as the vertical field plate, and a third portion overlying the fifth layer, wherein a thickness of a dielectric layer between the gate and the channel, the vertical sidewall, and the fifth layer is equal.

7. The transistor of claim 3 wherein the gate has a first portion overlying the channel, a second portion facing the vertical sidewall of the second layer acting as the vertical field plate, and a third portion overlying the fifth layer, wherein a thickness of a dielectric layer between the gate and the channel is less than a thickness of a dielectric layer between the gate and the fifth layer.

8. The transistor of claim 3 wherein the gate has a first portion overlying the channel, a second portion facing the vertical sidewall of the second layer acting as the vertical field plate, and a third portion overlying the fifth layer, wherein there are varying thicknesses of a dielectric layer between the gate and the vertical sidewall.

9. The transistor of claim 2 wherein the fourth layer includes a first portion below the well region, where the first portion is abutted on opposite lateral sides by the third layer.

10. The transistor of claim 9 wherein the first portion extends to the well region.

11. The transistor of claim 10 wherein a fifth layer of the first conductivity type is formed abutting lateral sides of the fourth layer and abutting a bottom surface of the fourth layer.

12. The transistor of claim 2 further comprising a fifth layer of the first conductivity type between the well region and the second layer, the fifth layer having a dopant concentration higher than that of the second layer.

13. The transistor of claim 2 further comprising:
a fifth layer of the first conductivity type below the third layer; and
a sixth layer of the second conductivity type laterally abutting the fifth layer on opposite sides of the fifth layer, the sixth layer being below the fourth layer, a dopant concentration in the fifth layer and sixth layer being higher than the first dopant concentration.

14. The transistor of claim 2 wherein the substrate is of the first conductivity type, and wherein the transistor is a MOSFET.

15. The transistor of claim 2 wherein the substrate is of the second conductivity type, and wherein the transistor is an IGBT.

16. The transistor of claim 1 wherein the gate is also located along the vertical sidewall of the second layer as the vertical field plate so as to modulate a conductivity of the vertical sidewall when the gate is biased above the threshold voltage.

17. The transistor of claim 16 wherein a first dielectric layer is located between the gate and the top surface of the well region, wherein a second dielectric layer is located between the gate and the sidewall, and wherein a thickness of the first dielectric layer is the same as the thickness of the second dielectric layer.

18. The transistor of claim 16 wherein a first dielectric layer is located between the gate and the top surface of the well region, wherein a second dielectric layer is located between the gate and the sidewall, and wherein a thickness of the first dielectric layer is less than the thickness of the second dielectric layer.

19. The transistor of claim 1 further comprising a third layer of the second conductivity type below the trench and laterally adjacent to the second layer, wherein the vertical field plate and the second dopant concentration of the second layer are configured to enhance lateral depletion of the second layer so that the second layer is fully depleted at a breakdown voltage of the transistor.

20. The transistor of claim 1 further comprising:
a third layer of the first conductivity type between the first layer and the second layer and located below the channel; and
a fourth layer of the second conductivity type laterally abutting the third layer on opposite sides of the third layer, a dopant concentration in the third layer and fourth layer being higher than the first dopant concentration,
wherein the third layer and the fourth layer form N-type and P-type columns, where the N-type and P-type columns are fully depleted at a breakdown voltage of the transistor.

21. The transistor of claim 2 wherein the third layer is more highly doped than the first layer and second layer.

22. The transistor of claim 1 further comprising a third layer of the second conductivity type below the trench and laterally adjacent to the second layer.

23. The transistor of claim 22 further comprising a conductive material in the trench and above the third layer, the conductive material being electrically connected to the second electrode.

24. The transistor of claim 1 wherein the vertical field plate is deeper than the well region.

\* \* \* \* \*